United States Patent
Olsen et al.

(10) Patent No.: US 9,281,461 B2
(45) Date of Patent: *Mar. 8, 2016

(54) THERMOELECTRIC DEVICES AND APPLICATIONS FOR THE SAME

(75) Inventors: Larry C. Olsen, Richland, WA (US); John G. DeSteese, Kennewick, WA (US); Peter M. Martin, Kennewick, WA (US); John W. Johnston, Yakima, WA (US); Timothy J. Peters, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 1787 days.

This patent is subject to a terminal disclaimer.

(21) Appl. No.: 10/581,281

(22) PCT Filed: Dec. 2, 2004

(86) PCT No.: PCT/US2004/040460
§ 371 (c)(1),
(2), (4) Date: May 31, 2006

(87) PCT Pub. No.: WO2006/001827
PCT Pub. Date: Jan. 5, 2006

(65) Prior Publication Data
US 2007/0125413 A1    Jun. 7, 2007

Related U.S. Application Data

(63) Continuation-in-part of application No. 10/726,744, filed on Dec. 2, 2003, and a continuation-in-part of application No. 10/727,062, filed on Dec. 2, 2003.

(60) Provisional application No. 60/558,298, filed on Mar. 30, 2004.

(51) Int. Cl.
*H01L 35/30* (2006.01)
*H01L 35/08* (2006.01)

(52) U.S. Cl.
CPC ............... *H01L 35/30* (2013.01); *H01L 35/08* (2013.01); *H01L 2924/0002* (2013.01)

(58) Field of Classification Search
CPC ............................. H01L 35/08; H01L 35/30
See application file for complete search history.

(56) References Cited

U.S. PATENT DOCUMENTS

| | | |
|---|---|---|
| 3,554,815 A | 1/1971 | Osborn |
| 3,648,470 A | 3/1972 | Schultz |

(Continued)

FOREIGN PATENT DOCUMENTS

| | | |
|---|---|---|
| CH | 677421 | 5/1991 |
| CN | 1447450 | 10/2003 |

(Continued)

OTHER PUBLICATIONS

Final Office action from the U.S. Patent and Trademark Office in U.S. Appl. No. 11/004,611, dated Dec. 17, 2008.

(Continued)

*Primary Examiner* — Golam Mowla
(74) *Attorney, Agent, or Firm* — Klarquist Sparkman, LLP

(57) ABSTRACT

High performance thin film thermoelectric couples and methods of making the same are disclosed. Such couples allow fabrication of at least microwatt to watt-level power supply devices operating at voltages greater than one volt even when activated by only small temperature differences.

30 Claims, 16 Drawing Sheets

(56) References Cited

U.S. PATENT DOCUMENTS

| | | | |
|---|---|---|---|
| 3,900,603 A | 8/1975 | Rittmayer et al. | |
| 3,931,673 A | 1/1976 | Eggemann | |
| 3,945,855 A | 3/1976 | Skrabek et al. | |
| 3,981,751 A | 9/1976 | Dashevsky et al. | |
| 4,036,665 A * | 7/1977 | Barr et al. | 136/202 |
| 4,092,140 A | 5/1978 | Cerutti et al. | |
| 4,125,122 A | 11/1978 | Stachurski | |
| 4,249,121 A | 2/1981 | Dahlberg | |
| 4,312,402 A | 1/1982 | Basiulis | |
| 4,328,677 A | 5/1982 | Meckler | |
| 4,447,277 A | 5/1984 | Jayadev et al. | |
| 4,497,973 A | 2/1985 | Heath et al. | |
| 4,520,305 A | 5/1985 | Cauchy | |
| 4,566,961 A | 1/1986 | Diaz et al. | |
| 4,677,416 A | 6/1987 | Nishimoto et al. | |
| 4,859,250 A | 8/1989 | Buist | |
| 4,940,976 A | 7/1990 | Gastouniotis et al. | |
| 5,228,923 A | 7/1993 | Hed | |
| 5,286,304 A | 2/1994 | Macris et al. | |
| 5,505,835 A | 4/1996 | Sakaue et al. | |
| 5,883,563 A | 3/1999 | Horio et al. | |
| 6,046,398 A | 4/2000 | Foote et al. | |
| 6,096,964 A | 8/2000 | Ghamaty et al. | |
| 6,096,965 A | 8/2000 | Ghamaty et al. | |
| 6,162,985 A | 12/2000 | Parise | |
| 6,207,887 B1 | 3/2001 | Bass et al. | |
| 6,215,580 B1 | 4/2001 | Kouta | |
| 6,232,543 B1 | 5/2001 | Nagata | |
| 6,288,321 B1 | 9/2001 | Fleurial et al. | |
| 6,312,617 B1 | 11/2001 | Kanatzidis et al. | |
| 6,340,787 B1 | 1/2002 | Simeray et al. | |
| 6,372,538 B1 | 4/2002 | Wendt et al. | |
| 6,388,185 B1 | 5/2002 | Fleurial et al. | |
| 6,413,645 B1 | 7/2002 | Graff et al. | |
| 6,458,319 B1 | 10/2002 | Caillat et al. | |
| 7,081,677 B2 | 7/2006 | Yamashita et al. | |
| 2002/0139123 A1 | 10/2002 | Bell | |
| 2002/0148236 A1 | 10/2002 | Bell | |
| 2003/0089391 A1 | 5/2003 | Fukudome et al. | |
| 2003/0099279 A1 | 5/2003 | Venkatasubramanian et al. | |
| 2003/0140957 A1 | 7/2003 | Akiba | |
| 2003/0183839 A1 | 10/2003 | Yamashita et al. | |
| 2004/0075167 A1 | 4/2004 | Nurnus et al. | |
| 2004/0094192 A1 | 5/2004 | Luo | |
| 2004/0231714 A1 | 11/2004 | Stark et al. | |
| 2004/0242169 A1 | 12/2004 | Albsmeier et al. | |
| 2005/0115600 A1 | 6/2005 | DeSteese et al. | |
| 2005/0115601 A1 | 6/2005 | Olsen et al. | |
| 2005/0139250 A1 | 6/2005 | DeSteese et al. | |
| 2008/0173537 A1 | 7/2008 | DeSteese et al. | |

FOREIGN PATENT DOCUMENTS

| | | |
|---|---|---|
| DE | 6900274 | 8/1970 |
| DE | 2124465 | 11/1972 |
| DE | 2457586 | 6/1975 |
| DE | 297 23 309 | 3/1997 |
| DE | 10231445 | 1/2004 |
| EP | 0034538 | 8/1981 |
| EP | 0408572 A1 | 8/1989 |
| EP | 0408572 | 1/1991 |
| EP | 0408572 B1 | 2/1993 |
| GB | 1381001 | 1/1975 |
| JP | 43-25391 | 11/1968 |
| JP | 53-031985 | 3/1978 |
| JP | 61259580 | 11/1986 |
| JP | 02198181 | 6/1990 |
| JP | 3-502859 | 6/1991 |
| JP | 7-7186 | 1/1995 |
| JP | 7-7335943 | 12/1995 |
| JP | 09107129 | 4/1997 |
| JP | 09224387 | 8/1997 |
| JP | 10-51037 | 2/1998 |
| JP | 11-41958 | 2/1999 |
| JP | 2003-92432 | 3/2003 |
| JP | 2003-13360 | 5/2003 |
| JP | 2003179275 | 6/2003 |
| JP | 2004104041 | 4/2004 |
| JP | 2004241657 | 8/2004 |
| JP | 2006086510 | 3/2006 |
| SU | 2113035 | 8/1990 |
| WO | 89/07836 | 8/1989 |
| WO | 99/54941 | 10/1999 |
| WO | 00/30185 | 5/2000 |
| WO | 02/23642 | 3/2002 |
| WO | 02/095707 | 11/2002 |
| WO | 03/007391 | 1/2003 |
| WO | 03/015186 | 2/2003 |
| WO | 2004/105143 | 12/2004 |
| WO | 2004/105146 | 12/2004 |
| WO | 2005/074463 | 8/2005 |
| WO | 2005/098970 | 10/2005 |
| WO | 2005/117154 | 12/2005 |
| WO | 2008/013584 | 1/2008 |

OTHER PUBLICATIONS

Office Action from Chinese Patent Office for Chinese Patent Application No. 200480035827.0, dated Dec. 5, 2008.

Office action from the U.S. Patent and Trademark Office in U.S. Appl. No. 10/727,062, dated Dec. 31, 2008.

Abrikosov, N Kh, et al., "Phase transitions and electrophysical properties of the solid solutions based on GeTe at the cross-section of GeTe—AgSbTe$_2$," *Izvestiya Akademii Nauk SSSR, Neoorganicheskie Materialy*, Abstract Only, vol. 20, No. 1, pp. 55-59 (1984).

Androulakis et al., "Nanostructuring and its Influence on the Thermoelectric Properties of the AgSbTe2—SnTe Quaternary System," *Materials Research Society Symposium Proceedings*, vol. 886, Abstract Only, 1 page (2006).

Decheva, S.K., "Studies on the Thermoelectric Characteristics of Cold-Pressed Materials of the Type of (GeTe)x—(AgSbTe$_2$) (1—x)," *Bulgarian Journal of Physics*, Abstract Only, vol. 6, No. 2, pp. 194-200 (1979).

DeSteese, J. G. et al., "Technology Development: Wireless Sensors and Controls BT0201," Excerpt from Statement of Work from PNNL to U.S. Department of Energy, Building Technologies Program, 31 pages (Sep. 2004).

DeSteese, J. G., "Thermoelectric Ambient Energy Harvester," a White Paper for the Defense Logistics Agency, pp. 1-4 (undated).

International Search Report and Written Opinion for PCT/US2004/040460, filed Dec. 2, 2004 (mailed Mar. 7, 2006).

Martin, P. M. et al., "Si/SiGe Superlattices for Thermoelectric Applications" *Proceedings of the 46th Annual Technical Conference of the Society of Vacuum Coaters*, pp. 126-129 (2003).

Martin, P. M. et al., "Scale Up of Si/ Si$_{0.8}$Ge$_{0.2}$ and B$_4$C/B$_9$C Superlattices for Harvesting of Waste Heat," *Proceedings of DEER*, 6 pages (2003).

Martin, P. M. et al., "Recent Advances in Scale Up of Si/SiGe Superlattices for Thermoelectric Applications," Abstract Only, presented at the Functional Coating and Surface Engineering Conference 2003, Montreal, Canada, 3 pages (Jun. 4-7, 2003).

Martin, P. M. et al., "Nanostructured multilayer B$_4$C/B$_9$C and Si/Si$_{0.8}$Ge$_{0.2}$ films for advanced detector and thermoelectric applications," *Proceedings of 2004 AIMCAL Conference*, 7 pages (2004).

Martin, P. M. et al., "Superlattice Coatings for Device, Structural and Protective Applications," *Proceedings of AIMCAL 2006 Fall Technical Conference*, invited, 10 pages (2006).

Martin, P. M. et al., "Recent advances in magnetron sputtered superlattice and quantum well structures," *Proceedings of SPIE*, vol. 6403, pp. 640310-10-to 640310-11 (2006).

Martin, P. M. et al., "Magnetron-Sputtered Nanolaminate and Superlattice Coatings," *Proceedings of SPIE*, vol. 6403, pp. 640310-1 to 640310-9 (2006).

Office action from the U.S. Patent and Trademark Office in U.S. Appl. No. 10/726,744, dated Jun. 27, 2007.

Office action from the U.S. Patent and Trademark Office in U.S. Appl. No. 11/004,611, dated Jan. 7, 2008.

(56) References Cited

OTHER PUBLICATIONS

Office action from the U.S. Patent and Trademark Office in U.S. Appl. No. 10/727,062, dated Jun. 14, 2007.
Plachkova, S.K. et al., "Materials for Thermoelectric Application Based on the System GeTe—AgBiTe$_2$," *Physica Status Solidi (A)*, Abstract Only, vol. 184, Issue 1, pp. 195-200 (Mar. 2001).
Plachkova, S.K., "Thermoelectric figure of merit of the system (GeTe)$_{1-x}$(AgSbTe$_2$)$_x$," *Phys. Stat. Sol (A)*, Abstract Only, vol. 83, No. 1, pp. 349-356 (1984).
Plachkova, S.K., "Thermoelectric Power in the System (GeTe)$_{1-x}$(AgSbTe$_2$)$_x$," *Phys. Status Solidi (A)*, Abstract Only, vol. 80, No. 1, pp. K97-K100 (Nov. 16, 1983).
Sharp, J. W., "Some Properties of GeTe-Based Thermoelectric Alloys," *IEEE 22nd International Conference on Thermoelectrics*, pp. 267-270 (2003).
Yamanaka, S. et al., "Thermoelectric properties of T$_{19}$BiTe$_3$," *Journal of Alloys and Compounds*, vol. 352, pp. 275-278 (2003).
Office Action from the European Patent Office for European Patent Application No. 04822138.6, dated Feb. 11, 2009.
Office Action from the Japanese Patent Office for Japanese Patent Application No. 2006-542773, dated Feb. 23, 2009 (with translation).
Final Office action from the U.S. Patent and Trademark Office for U.S. Appl. No. 10/726,744, dated Feb. 29, 2008.
Stölzer, M. et al., "Optimisation of p—(Bi$_{0.25}$Sb$_{0.75}$)$_2$ Te$_3$ and n—Bi$_2$(Te$_{0.9}$Se$_{0.1}$)$_3$ Films for Thermoelectric Thin Film Components," 2nd Symposium on Thermoelectrics-Materials, Processing Techniques & Applications, 5 pages (1994).
Bergstresser, T.R. et al., "Copper on Polyimide Flexible Substrate for Ultra-Thin, High Performance Applications," 4 pages (2000).
Chen, G., "Thermal conductivity and ballistic-phonon transport in the cross-plane direction of superlattices," *Phys. Rev. B*, vol. 57, No. 23, pp. 14958-14973 (Jun. 15, 1998).
Hicks, L.D. et al., "Effect of quantum-well structures on the thermoelectric figure of merit," *Phys. Rev. B*, vol. 47, No. 19, pp. 12727-12731 (May 15, 1993).
Kiely, J.H. et al., "Characteristics of Bi$_{0.5}$Sb$_{1.5}$Te$_3$/Be$_2$Te$_{2.4}$Se$_{0.6}$ thin-film thermoelectric devices for power generation," *Meas. Sci. Technol.*, vol. 8, pp. 661-665 (Jun. 1997).
Nolas, G.S. et al., Thermoelectrics, "Basic Principles and New Materials Developments," Springer, Berline, pp. 111-146 (2001).
Schaevitz, Samuel B. et al., "A Combustion-Based MEMS Thermoelectric Power Generator," The 11$^{th}$ International Conference on Solid-State Sensors and Actuators, Munich, Germany, 4 pages (Jun. 10-14, 2001).
Schmidt, F. et al., "Batterielose Funksensoren, betrieben mit Energie aus der Umgebung," 5 pages (Mar. 2002).
Stark, Ingo et al., "New Micro Thermoelectric Devices Based on Bismuth Telluride-Type Thin Solid Films," 18$^{th}$ International Conference on Thermoelectrics, pp. 465-472 (1999).
Stölzer, M. et al., "Optimisation of p—(Bi$_{0.25}$Sb$_{0.75}$)$_2$Te$_3$ and n—Bi$_2$(Te$_{0.9}$Se$_{0.1}$)$_3$ Films for Thermoelectric Thin Film Components," 5 pages.
Stölzer, M. et al., "Preparation of Highly Effective p-Bi$_{2.5}$Sb$_{1.5}$Te$_3$ and n-Bi$_2$Te$_{2.7}$Se$_{0.3}$ Films," 15$^{th}$ International Conference on Thermoelectrics, pp. 445-449 (1996).
Stordeur, Matthias et al., "Low Power Thermoelectric Generator—self-sufficient energy supply for micro systems," 16$^{th}$ International Conference on Thermoelectrics, pp. 575-577 (1997).
Tritt, T., "Recent Trends in Thermoelectric Materials Research III," Academic Press, London, vol. 7, pp. 50-55 (2001).
Venkatasubramanian, Rama et al., "Thin-film thermoelectric devices with high room-temperature figures of merit," *Nature*, vol. 413, pp. 597-602 (Oct. 11, 2001).
Vining, Cronin B., "Semiconductors are cool," *Nature*, vol. 413, pp. 577-578 (Oct. 11, 2001).
21$^{st}$ International Conference on Thermoelectrics, Jet Propulsion Laboratory, California Institute of Technology, Massachusetts Institute of Technology; "Texture formation in extruded rods of (Bi,SB)2(Te,Se)3 thermoelectric alloys," Vasilevskiy, E. et al. (Aug. 26-29, 2002).
Thin-film Superlattice Thermoelectric Technology, www.rti.org, 4 pages (2002).
Physics of Thin Films: Sputter Deposition (Ohring: Chapter 3, sections 5-6), www.uccs.edu/~tchriste/courses/PHYS549/549lectures/sputter.html., 4 pages (Printed Nov. 21, 2002).
Physics of Thin Films: Sputter Deposition Techniques (Ohring: Chapter 3, section 7), www.uccs.edu/~tchriste/courses/PHYS549/549lectures/sputtertech.html., 5 pages (Printed Nov. 21, 2002).
Venkatasubramanian, R., "Thin-film Superlattice Thermoelectric Devices for Power Conversion and Cooling," www.its.org/its/ict2002/Abstracts/Rama_Venkatasubramanian.htm (Printed Sep. 26, 2003).
D.T.S. GmbH: Thin Film Thermoelectric Generators, D.T.S., www.dts-generator.com/index.htm (Printed May 4, 2004).
D.T.S. GmbH: Thin Film Thermoelectric Generators, Low Power Thermoelectric Generators; www.dts-generator.com/gen.txe.htm (Printed May 4, 2004).
D.T.S. GmbH: Thin Film Thermoelectric Generators, Infrared-Sensors, www.dts-generator.com/sen-txe.htm (Printed May 4, 2004).
D.T.S. GmbH: Thin Film Thermoelectric Generators, Research and development, www.dts-generator.com/dev-txe.htm (Printed May 4, 2004).
Final Office action from the U.S. Patent and Trademark Office in U.S. Appl. No. 10/727,062, dated Jun. 16, 2008.
Office action from the U.S. Patent and Trademark Office in U.S. Appl. No. 10/726,744, dated Aug. 4, 2008.
Böttner, H., "Thermoelectric Micro Devices: Current State, Recent Developments and Future Aspects for Technological Progress and Applications," *Proc. 21st Int. Conf. Thermoelectronics*, Long Beach, CA, pp. 511-518 (Aug. 25-29, 2002).
Final Office action from the U.S. Patent and Trademark Office for U.S. Appl. No. 10/726,744, dated Apr. 13, 2009.
Final Office action from the U.S. Patent and Trademark Office in U.S. Appl. No. 10/727,062, dated Jul. 20, 2009.
Kim, D.-H. et al., "Effect of deposition temperature on the structural and thermoelectric properties of bismuth telluride thin films grown by co-sputtering," *Thin Solid Films*, vol. 510, pp. 148-153 (2006).
Nurnus, J. et al., "Structural and Thermoelectric Properties of Bi$_2$Te$_3$ Based Layered Structures," *Proc. 19th Int. Conf. Thermoelectrics*, Cardiff, U.K., pp. 236-240 (Aug. 25 29, 2000).
Office action from the U.S. Patent and Trademark Office in U.S. Appl. No. 11/004,611, dated Aug. 3, 2009.
Sun, C.W. et al., "Crystallization behavior of non-stoichiometric Ge—Bi—Te ternary phase change materials for PRAM application," *J. Phys. Condens. Matter*, vol. 19, 446004, 9 pages (2007).
Allinson, A.J. et al., "Microstrucural Changes in a Monostable Chalcogenide Switch Glass," *Journal of Non-Crystalline Solids*, vol. 31, No. 1, pp. 307-331 (Apr. 1, 1979).
Cook, A. B. et al., "Nature of the cubic to rhombohedral structural transformation in (AgSbTe$_2$)$_{12}$(GeTe)$_{85}$ thermoelectric material," *Journal of Applied Physics*, vol. 101, No. 5, pp. 053715-1-053715-6 (Mar. 14, 2007).
International Search Report and Written Opinion for PCT/US2008/074345, filed Aug. 26, 2008 (mailed Sep. 16, 2009).
International Search Report and Written Opinion for PCT/US2008/077748, filed Sep. 25, 2008 (mailed Sep. 22, 2009).
Office action from the U.S. Patent and Trademark Office in U.S. Appl. No. 10/726,744, dated Oct. 1, 2009.
Wagner, Andrew V. et al., "Sputter Deposition of Semiconductor Superlattices for the Thermoelectric Applications," *Mat. Res. Soc. Symp. Proc.*, vol. 450, pp. 467-472 (Dec. 2-5, 1996).
Office Action from the Korean Patent Office for Korean Patent Application No. 2006-7013287, dated Feb. 10, 2011 (with translation).
Report NYO 35-82-12, Final Phase I Report for Compact Thermoelectric Program, 42nd Ed., 330 pp., Jun. 28, 1965-Dec. 31, 1965.
Final Office action from the U.S. Patent and Trademark Office in U.S. Appl. No. 11/004,611, dated Mar. 4, 2010.
Kim, et al., "Effects of a Reduction Treatment and Te Doping Properties of (Bi$_{1-x}$Sb$_x$)$_2$Te$_3$ Fabricated by Mechanical Alloying," *16th International Conference on Thermoelectrics*, pp. 127-130 (1997).

(56) References Cited

OTHER PUBLICATIONS

Notification of Reasons for Refusal from the Japanese Patent Office for Japanese Patent Application No. 2006-542773, dated Jan. 20, 2010 (with translation).
Office action from the U.S. Patent and Trademark Office in U.S. Appl. No. 10/726,744, dated Mar. 3, 2010.
Yamashita, O. et al., "Bismuth telluride compounds with high thermoelectric figures of merit," *Journal of Applied Physics*, vol. 93, No. 1, pp. 368-374 (Jan. 1, 2003).
Notice of Allowance from the U.S. Patent and Trademark Office in U.S. Appl. No. 10/727,062, dated Jan. 11, 2010.
Final Office action from the U.S. Patent and Trademark Office for U.S. Appl. No. 10/726,744, dated Dec. 6, 2010.
Mattox, D. M., Handbook of Physical Vapor Deposition (PVD) Processing. William Andrew Publishing/Noyes., Chapter 6, pp. 343-405 (1998).
Office action from the U.S. Patent and Trademark Office in U.S. Appl. No. 11/004,611, dated Dec. 17, 2010.
Office action from the U.S. Patent and Trademark Office in U.S. Appl. No. 11/864,877, dated Nov. 23, 2010.
Restriction Requirement from the U.S. Patent and Trademark Office in U.S. Appl. No. 11/864,877, dated Oct. 18, 2010.
Notice of Reasons for Rejection from the Japanese Patent Office for Japanese Patent Application No. 2006-542773, dated Aug. 19, 2010 (w/ English translation).
Notice of Allowance from the U.S. Patent and Trademark Office in U.S. Appl. No. 10/727,062, dated Sep. 20, 2010.
Office Action from the Chinese Patent Office for Chinese Patent Application No. 200480035827.0, dated Aug. 5, 2010 (w/ English translation).
Office Action from the Korean Patent Office for Korean Patent Application No. 2006-7013287, dated Nov. 18, 2011 (with translation).
Decision on Rejection from the Japanese Patent Office for Japanese Patent Application No. 2006-542773, dated Oct. 3, 2011 (with translation).
Final Office action from the U.S. Patent and Trademark Office in U.S. Appl. No. 11/004,611, dated Jul. 8, 2011.
Office Action from the Canadian Patent Office for Canadian Patent Application No. 2,549,826, dated Jun. 17, 2011.
Office action from the U.S. Patent and Trademark Office in U.S. Appl. No. 11/864,877, dated May 23, 2011.
Summons from the European Patent Office for European Patent Application No. 04822138.6, dated Apr. 28, 2011.

* cited by examiner

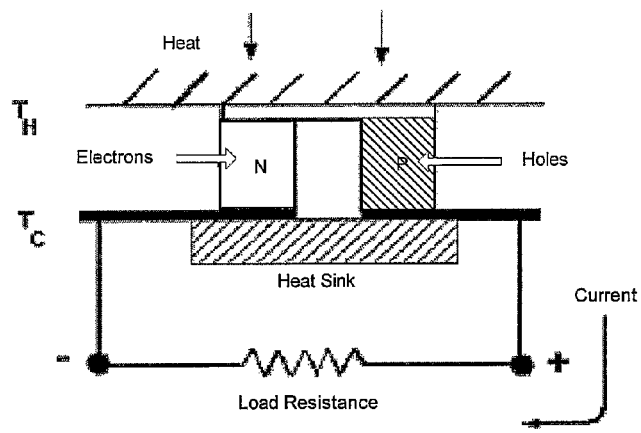
FIG. 1a
PRIOR ART
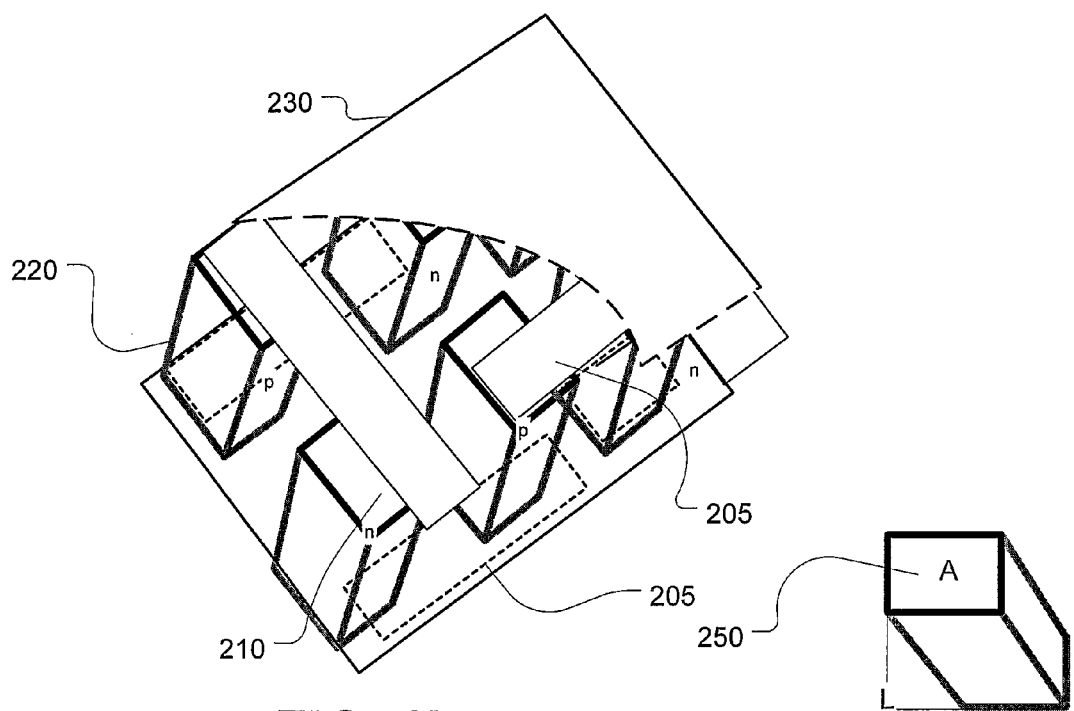
FIG. 1b
PRIOR ART
FIG. 1c
PRIOR ART

Sb2Te3-Bi2Te3

THERMOELECTRIC DEVICES AND APPLICATIONS FOR THE SAME

CROSS REFERENCE TO RELATED APPLICATIONS

This is the U.S. National Stage of International Application No. PCT/US2004/040460, filed Dec. 2, 2004, which was published in English under PCT Article 21(2), which is a continuation-in-part of U.S. Patent Application No. 10/726,744, filed Dec. 2, 2003, and is also a continuation-in-part of U.S. Patent Application No. 10/727,062, filed Dec. 2, 2003, and claims the benefit of U.S. Provisional Patent Application No. 60/558,298, filed Mar. 30, 2004, all of which are incorporated herein by reference.

STATEMENT OF GOVERNMENT SUPPORT

This invention was made with Government support under Contract DE AC0676RLO1830 awarded by the U.S. Department of Energy. The Government has certain rights in the invention.

FIELD

The present disclosure relates to thermoelectric devices, materials and methods of making and using the same to produce efficient thermoelectric devices.

BACKGROUND

The increasing use of portable electronics has driven research in the area of portable electric generators. Thermoelectric (TE) power sources have been found to be especially useful. TE power sources typically comprise three parts: a heat source, a heat sink, and a thermopile. The thermopile, consisting of a number of thermocouples connected in series, serves to convert some of the thermal energy into electrical energy. TE power sources generate electric power based on creating a thermal gradient across the thermocouples of the thermopile. The TE power source operates to convert the thermal energy to electric power by accepting thermal energy on a "hot" side or junction, passing it through the thermopile and rejecting heat to a "cold" side or junction.

Certain TE power sources and TE thermocouples in particular are formed using semiconductor materials. Semiconductor materials with dissimilar characteristics are connected electrically in series (to form thermocouples) and thermally in parallel, so that two junctions are created. The semiconductor materials are typically n-type and p-type. In a typical thermoelectric device, the electrically conductive connection is formed between the p-type and n-type semiconductor materials. These materials are so named because of their structure: the n-type has more electrons than necessary to complete a perfect molecular lattice structure while the p-type does not have enough electrons to complete a lattice structure. The extra electrons in the n-type material and the holes left in the p-type material are called "carriers." The carriers are driven from the hot junction to the cold junction as a result of thermal diffusion resulting in an electrical current. For thermoelectric cooling, the electrons and holes transport heat as a result of imposed electrical current. Prior art FIG. 1a illustrates a form of such power conversion. Cooling action results from reversing the process.

A semiconductor TE device's performance is limited by the non-dimensional thermoelectric FIG. of merit (ZT) of the material, where T is the absolute temperature and Z is the thermoelectric FIG. of merit, $Z = sa^2/k$ (a-thermoelectric power, s-electrical conductivity, k-thermal conductivity). Typically TE devices are preferably formed of TE materials having relatively high thermoelectric figures of merit. In certain devices, however, the key objective is to produce power at voltages above 1.0 V in as small or compact a device as possible. The known TE materials having relatively high thermoelectric figures of merit cannot be deposited as thin films on substrates useful for forming small TE power source devices. Thus, although more efficient materials (i.e., materials with high ZT values) are typically better, for many applications it is more important that the resulting device be formed on a flexible substrate. As a result, although there may be some sacrifice of ZT value, using a TE material depositable on a substrate that allows fabrication of a small device with a relatively high voltage (without the need for a dc-dc converter) is better for certain applications. Unfortunately no such materials and methods are yet available.

Devices having ZT values of greater than 2.0 have been reported for Bi—Te/Sb—Te superlattices grown on single crystal GaAs. Such devices are not, however, suitable for many applications where hundreds or thousands of elements must be placed in a relatively small package.

Despite the potential and promise of TE devices, existing TE power sources have limited efficiency and electric potential when relatively small devices are made. Conventional semiconductor deposition techniques for making TE devices, such as electrochemical deposition, are not well suited for building optimally designed TE power sources. Difficult syntheses have limited the construction of many TE devices to bulk materials or minute quantities—each suffering from shortcomings in size or performance.

For example, currently available TE modules have structures similar to that depicted in prior art FIG. 1b, with each distinct thermoelement typically having a length and width on the order of a few millimeters. Such modules are described, for example, in U.S. Pat. No. 6,388,185 and C. B. Vining, Nature 413:577 (Oct. 11, 2001). These modules cannot provide voltages that readily match the input requirements of many devices, including power conditioning electronics.

A practical approach to building high-voltage, thin-film TE devices capable of microwatt power output in relatively small packages is needed. In addition, TE devices using a temperature gradient of about 10° C. or less would be helpful as well as TE devices operating at or near ambient temperatures. A number of applications require TE devices that operate at such temperatures and/or on such temperature gradients. For example, sensors used for building climate control or for other applications such as military applications where ambient energy is utilized if possible, operate on only 5 to 20° C. temperature differences.

In addition, in many circumstances, TE power sources and devices would be particularly useful in remote or inaccessible locations where hard-wired or battery-powered electrical energy sources are needed to operate particular devices. For example, remote sensors, such as might be used to measure temperature, pressure, humidity, the presence or movement of vehicles, humans and animals, or other environmental attributes, can easily be configured to acquire and transmit such data to a more accessible location. The conventional options available for providing power to such devices, such as batteries and solar cells, have drawbacks.

While battery technology has advanced tremendously in recent years, any device that draws electrical energy resulting from a chemical reaction has a useful life limited by the duration of the chemical reaction. Thus, remote applications relying exclusively on batteries are inherently limited by the battery life and reliability. Environmental factors can hinder the useful life of solar energy sources used in remote locations as well. Excessive cloud cover and shifting weather patterns can make solar cells unreliable. Dust and debris deposited on the surface of solar devices by rain or other weather related effects together with normal aging can also degrade the regular operation of these devices. Due to the drawbacks associated with these and other power technologies, there remains a need for reliable power sources that can operate over long time periods in remote locations.

Different constraints apply in non-remote settings. For example, in large buildings, tens of thousands of sensors could be usefully employed to provide smart sensing and control of energy delivery and distribution, as well as sensing and reporting of environmental conditions. At present, this vision is impractical because conventional power solutions are either technically inadequate or too expensive. Fitting every sensor with a battery power supply involves the above noted performance limitations of batteries in addition to the high cost of initial installation and periodic replacement. The alternative of hard wiring a large number of sensors to a central supply would improve reliability, but would necessarily involve complex circuitry and cost that make this approach economically unviable. These deficiencies of conventional solutions can be overcome by use of TE power sources such as TE power sources that produce electric power by harvesting and converting ambient energy in the manner provided by this disclosure.

One potential source of energy for the presently disclosed TE power sources and devices may be found in the differing temperatures that occur naturally in these remote, non-remote and less accessible locations, since thermoelectric devices can generate electric power in response to the existence of a temperature differential across the thermoelectric device. However, since the distances across conventional thermoelectric devices are typically small, heretofore none have been successfully configured to take advantage of the temperature variation between, for example, the ground below and the air above it.

SUMMARY

A key parameter affecting the voltage produced by TE modules (also referred to herein as couples or thermocouples) is the length-to-area (L/A) ratio of the individual thermoelements, where A is the cross sectional area of a thermoelement. Current monolithic (or discrete element) modules are characterized by L/A values of less than about 20 cm$^{-1}$. Although some superlattice TE devices have been proposed that have L/A values that are much higher than the current monolithic devices, the superlattice TE devices suffer other shortcomings. Current superlattice TE devices have been proposed to comprise a n-type superlattice structure having alternating layers of 50 Å in thickness with individual n-type elements being about 0.0001 cm in total thickness. Although superlattice TEs are relatively efficient with relatively high Seebeck coefficients, there is no superlattice TE technology where films are depositable on flexible substrates.

Currently, all superlattice materials are deposited on single crystals; the films are grown on GaAs substrates and then are removed and applied to another substrate. Thus, prior to this disclosure, superlattice TEs were not typically useful for applications requiring small or compact TE devices.

Accordingly, disclosed are various thermoelectric power devices and sources such as thin film thermoelectric (TE) modules and power sources. Certain embodiments of the disclosed thin film TE modules and power sources have relatively large L/A ratio values, greater than about 20 cm$^{-1}$ and perhaps more typically greater than about 100 cm$^{-1}$. Certain embodiments of the disclosed thin film TE modules and power sources have even larger L/A ratio values, for example up to about 1,000 to about 10,000 cm$^{-1}$ or greater. The L/A ratio values of certain embodiments of the disclosed TE power sources allow fabrication of μW to W power supplies providing voltages greater than 1 volt even when activated by relatively small temperature differences, such as 20° C. or 10° C., and certain embodiments even at temperature differences as small as about 5° C. The size of the disclosed TE power sources are relatively small—having volumes in the range of one to ten cm$^3$—much smaller than existing devices that operate in the 1 μW to 1 W range, and certain embodiments provide voltages of greater than 1 V.

More specifically, the disclosed thin film TE power sources comprise, in part, arrays of TE couples having multiple thermoelements (e.g., an n-type and a p-type thermoelement pair). The thermoelements are formed of sputter deposited thin films of $Bi_xTe_y$, $Sb_xTe_y$ and $Bi_xSe_y$ alloys where x is typically about 2 and y is typically about 3. The thermoelements form the modules (thermocouples) for converting thermal energy to electrical energy. Such thermoelements typically comprise thin films of TE materials having L/A ratios greater than about 500 cm$^1$. The devices include modules where thin films of p-type and n-type TE materials are deposited, e.g., on a suitable flexible substrate and are electrically connected to one another in series or in series-parallel.

Embodiments of the thin film TE power sources comprise multiple TE modules, a high-temperature member (or heat source) and a low-temperature member (some mechanism for removing heat). The TE power source may additionally include one or more hot and cold connections or junctions, such as ceramic plates or ceramic-coated metallic shoes or the like.

Novel methods of constructing such thin film TE elements, modules and devices, including sputter deposition of $Bi_xTe_y$, $Sb_xTe_y$ and $Bi_xSe_y$ alloys (where x is typically about 2 and y is typically about 3) and the use of templates are also disclosed. The process may be used to deposit n-type and p-type films that exhibit useful TE properties. In addition, in certain embodiments, electrically conductive material connecting the thermoelements of the module are sputter deposited as well. When deposited onto flexible substrates, such films find many practical uses where a TE module of almost any configuration is required.

In addition, disclosed are methods and TE power sources (such as the disclosed thin film TE modules and power sources) that utilize temperature differences existing in the environment, and convert these differences in temperature into electrical energy. Various TE power sources, including certain embodiments of the disclosed thin film TE power sources harvest ambient energy in the environment for providing electrical energy. First and second temperature regions in a particular environment are utilized by the disclosed TE devices. For example, the temperature regions can be adjacent features of the natural environment that exhibit a pervasive difference of temperature, such as the ground and the air above the ground or the air inside and outside of heating, air-conditioning or ventilation ducts in buildings.

While large temperature differences assist in the generation of electrical energy in a thermoelectric device, certain embodiments of the disclosed power sources allow for the generation of electrical energy in environments having very slight temperature differences. Accordingly, while not meant to be limiting, the temperature difference between the first temperature region and the second temperature region may be between 0.5° F. and 100° F. (about −18° C. and 38° C.) or between 0.5° F. and 50° F. (about −18° C. and 10° C.). The disclosed TE power sources and other devices are useful beyond these temperature ranges and at all intermediate temperature ranges. Further, the disclosed TE power sources and other devices are operable in applications wherein the relative temperatures of the first and second regions are reversed, as is the case, for example when soil is the first temperature region and air is the second temperature region, and the two are in a climate wherein the soil tends to be cooler than the air in the summer time, and hotter than the air in the winter time.

Certain embodiments of the TE power sources comprise a power source the disclosed thermocouple assembly (TE modules), a heat delivery heat pipe and a heat removal heat pipe (e.g., a low-temperature and a high-temperature heat pipe containing for example condensable fluids), and interfacing electronics including annular electronics, and power conditioning compartments. The heat delivery member and a heat removal member may be coupled to hot and cold junctions of the TE modules. One or both sides of the TE power source can be heated or cooled by other heat transport methods such as conduction, convection, and/or radiation. As such, these TE power sources can operate to produce electrical power in the range of, e.g., 100 microwatts to 100 milliwatts from small ambient differences in temperature (e.g., less than about 5° C., less than about 2° C., or less than about 1° C.). Further embodiments and descriptions are set forth throughout the specification and claims.

BRIEF DESCRIPTION OF THE DRAWINGS

FIG. 1a is a representation of a prior art illustration of a basic approach to thermoelectric energy conversion.

FIG. 1b is a diagram showing a prior art arrangement of discrete TE elements.

FIG. 1c is a representation illustrating the L/A ratio parameters for a single prior art TE element as shown in the device of FIG. 1b.

FIG. 2b illustrates the L/A ratio parameters for a single p-type thin film TE element of the embodiment of the module illustrated in FIG. 2a.

FIG. 9b illustrates representative dimensions of thermoelements in the embodiment of the TE thin film modules depicted in FIG. 9a.

DETAILED DESCRIPTION

TE modules comprising pairs of sputter deposited thin film thermoelements and electrically conductive members connecting the thermoelements to one another in series or in series-parallel are disclosed herein. Also disclosed are TE power source devices formed of multiple TE couples such as arrays of TE couples wherein the thin film thermoelements have an L/A ratio of greater than at least about 20 $cm^{-1}$ or greater than about 100 $cm^{-1}$ with certain embodiments having an L/A ratio of greater than 1000, 10,000 and even higher.

Unless otherwise indicated, all numbers expressing quantities of ingredients, properties such as L and A values, thicknesses, power levels, and so forth used in the specification and claims are to be understood as being modified by the term "about" whether explicitly stated or not. Accordingly, unless indicated clearly to the contrary, the numerical parameters set forth are approximations.

Figure 2A:
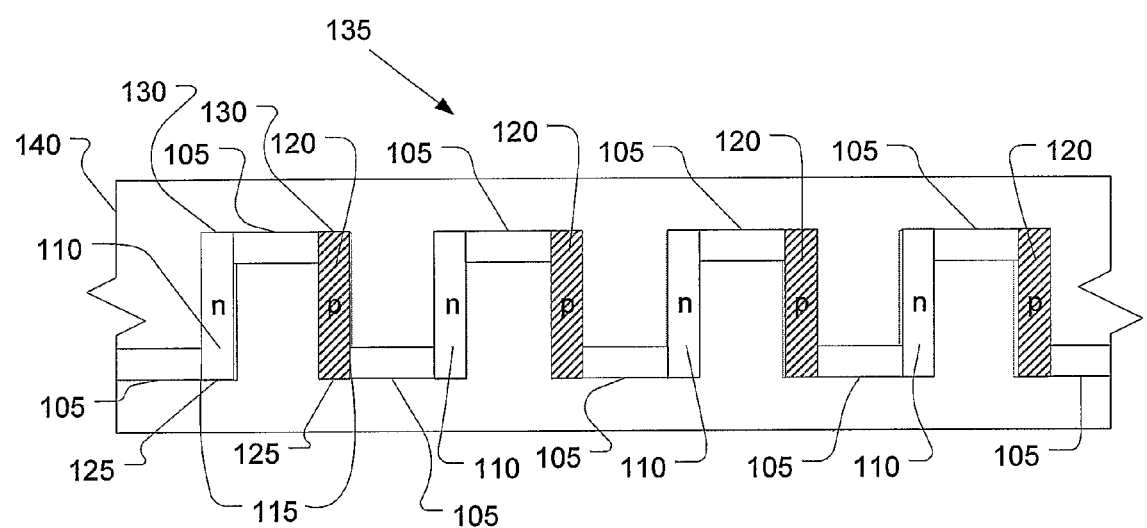
FIG. 2a illustrates a portion of an embodiment of the disclosed n-type/p-type TE thin film modules.

One embodiment of multiple thin film TE modules 115 utilized to form the disclosed TE power source 100 (see e.g., FIG. 4) is shown in FIG. 2a. FIG. 2a depicts a portion 135 of the TE power source 100, the portion 135 comprising the multiple TE modules 115 formed on a substrate 140. The TE modules 115 comprise pairs of n-type thermoelements 110 and p-type thermoelements 120 formed of semiconductor thin films.

Figure 14:
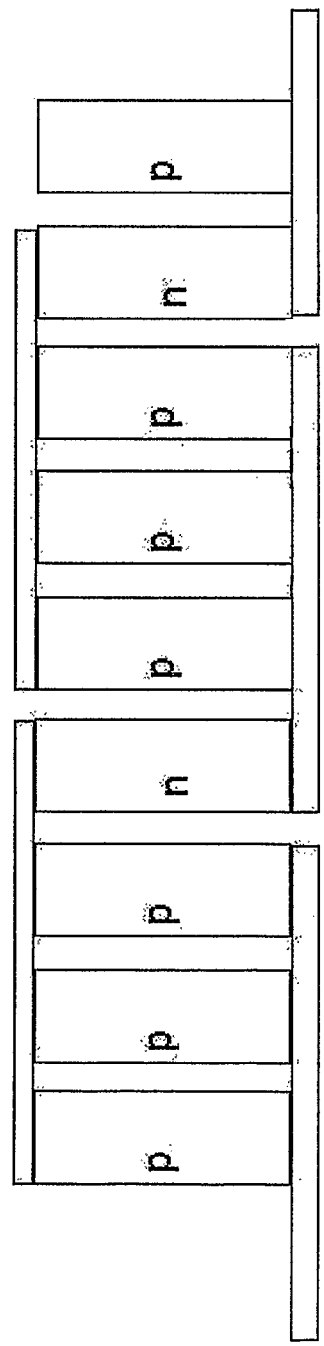
FIG. 14 shows an embodiment of the disclosed n-type and p-type TE thin films deposited on a flexible substrate wherein the n-type and p-type TE thin films are connected in a series-parallel arrangement.

Alternating n-type and p-type thermoelements 110, 120 of the TE modules 115 may be positioned parallel to one another as shown in FIG. 2a, in series-parallel as shown in FIG. 14, or may be placed in other suitable fashions (as mentioned below). Electrical connection (through electrically conductive member 105) of one n-type thermoelement 110 with one p-type element 120 forms a complete, single TE module 115 (also referred to as a thermocouple or a couple). Electrically conductive members 105 connect the n-type thermoelements 110 to p-type thermoelements 120, for example, alternately at adjacent thermoelement first ends 125 and adjacent thermoelement second ends 130 (as shown in FIG. 2a).

Figure 3:
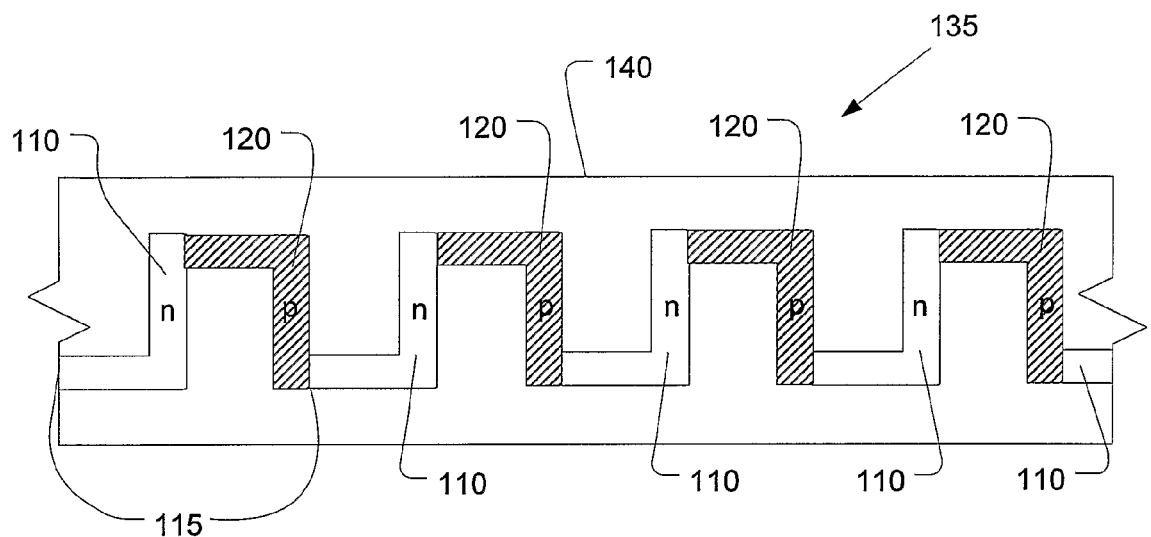
FIG. 3 illustrates a portion of an embodiment of the disclosed n-type/p-type TE thin film modules.

The electrically conductive members 105 may be substantially perpendicular to the elements 110, 120 or may be positioned in any suitable manner so as to electrically connect the thermoelements in series or in series parallel. In another possible configuration, there may be no separate electrically conductive members but instead the TE p-type and n-type alternating elements may be connected directly to one another, as for example shown in FIG. 3. Such a device would reduce the number of deposition steps required to form the TE module. For example, in another embodiment the n-type and/or p-type materials may be placed at angles to one another, connecting at alternating ends so that they come together at the hot and cold ends—forming a zigzag type configuration. In another possible alternative embodiment electrically conductive members are formed of the n-type or p-type elements themselves and are positioned as shown in FIG. 3. Clearly the individual TE elements and the array of TE elements making up a module may take a myriad of configurations.

The TE modules 115 may be formed on a flexible or a rigid substrate 140.

A TE power source 100 may include any number of TE couples 115 depending upon the application of the power source. Certain TE power sources comprise, e.g., from about 500 to 2000 TE modules 115. As a specific example application, a TE power source 100 used to power a temperature sensor or used to power a wireless transmitting device, with a power of 50 µW at 1.0 V, might utilize 600 to 800 n-p thermocouples (TE modules 115) with each TE element being about 1 cm long, 0.1 cm wide and 0.0001 cm in thickness. A nuclear TE power source designed to provide 100 mW at 1.0 V would potentially involve the same number of thermocouples, but the elements would more likely be about 0.2 cm in length, 1 cm wide and 0.0040 cm in thickness. The voltage required of the TE power source determines the number of thermocouples (TE modules) necessary and the desirable current determines the necessary L/A ratio of the thermoelements.

Figure 4:
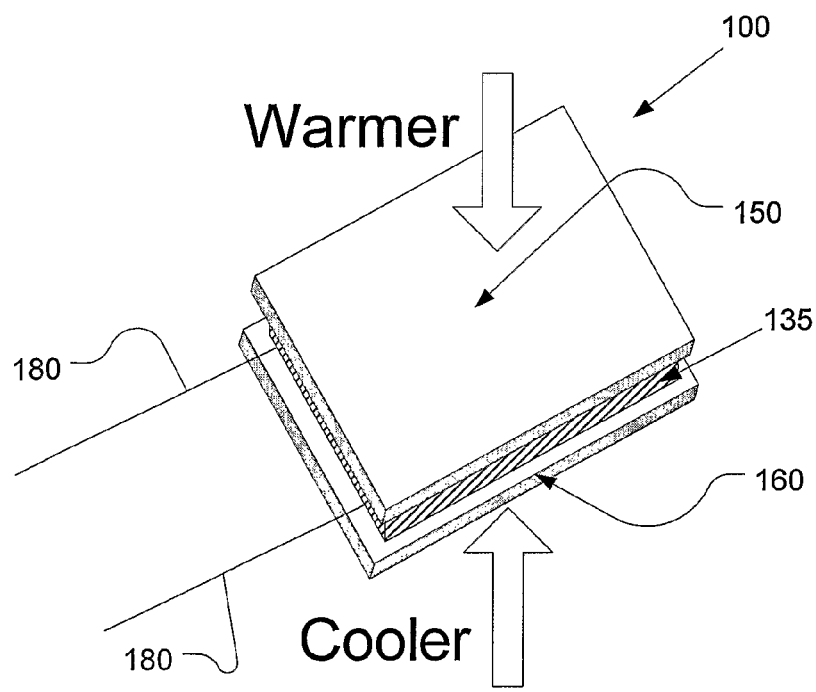
FIG. 4 illustrates an embodiment of the disclosed TE power source.
Figure 7:
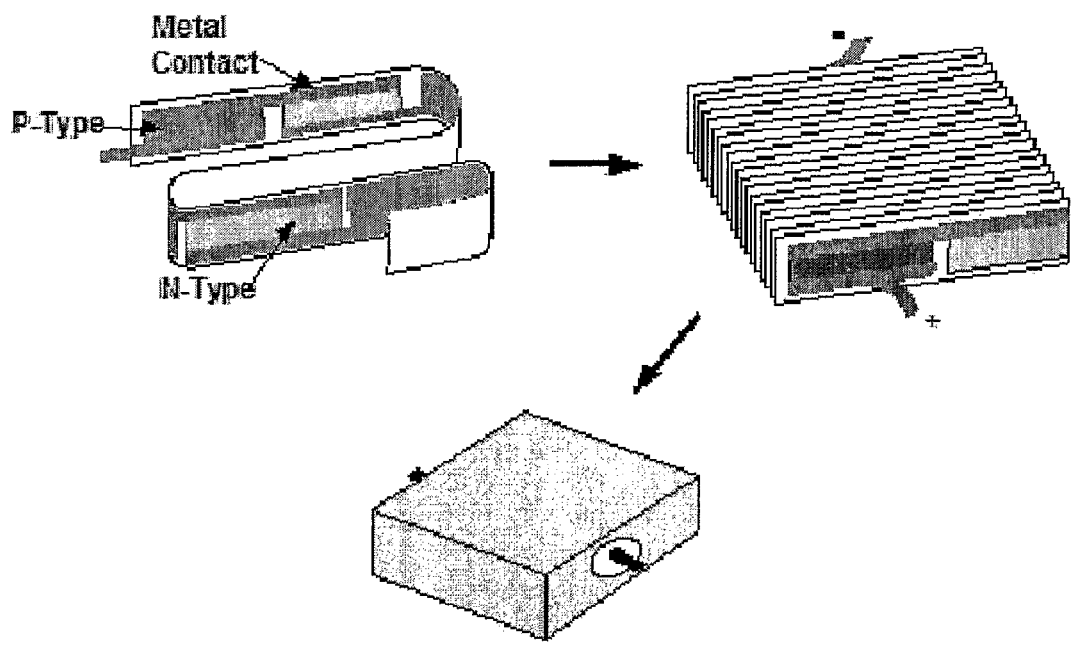
FIG. 7 illustrates an embodiment of the disclosed power source wherein arrays of TE thin film modules, such as those of FIG. 2a, FIG. 3, FIG. 6 or modules with relatively wider thermoelements are folded in an accordion configuration.
Figure 8:
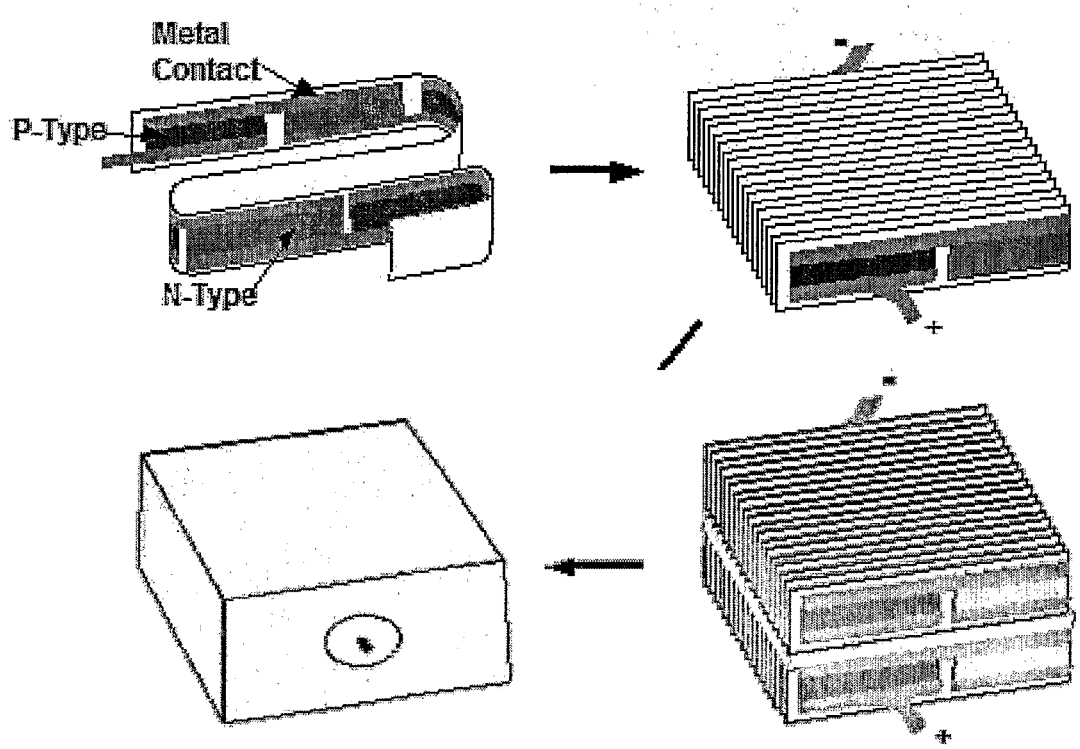
FIG. 8 illustrates an embodiment of the disclosed power source device wherein a nuclear heat source is positioned between arrays of TE thin film modules folded in an accordion configuration.

Possible embodiments of a complete TE power source 100 are shown in FIGS. 4, 7 and 8. In addition to the array of TE modules 135, the TE power source may comprise thermally conductive plates 150, 160, such as ceramic plates on the upper and lower edges of the substrate 140 (as shown in FIG. 4), a single ceramic plate, a ceramic shoe or other suitable enclosure devices. Electrical leads 180 are connected to the array of TE couples 135 of the TE device 100 to receive and transmit the electrical energy produced by the device.

The embodiment of the thin film TE power source 100 may further comprise a hot junction (or heat source) and a cold junction. The hot junction or heat source may comprise any suitable source depending upon the application of the device, for example a chemical energy source, heat from the environment, or a nuclear heat source as shown in FIG. 8. The cold junction may comprise any suitable heat removal mechanism constructed or positioned in a manner that allows heat to be relieved from or extracted from the TE power source. For example, the cold junction may comprise a heat pipe arrangement or exposure to the environment by, e.g., convection cooling.

Figure 5:
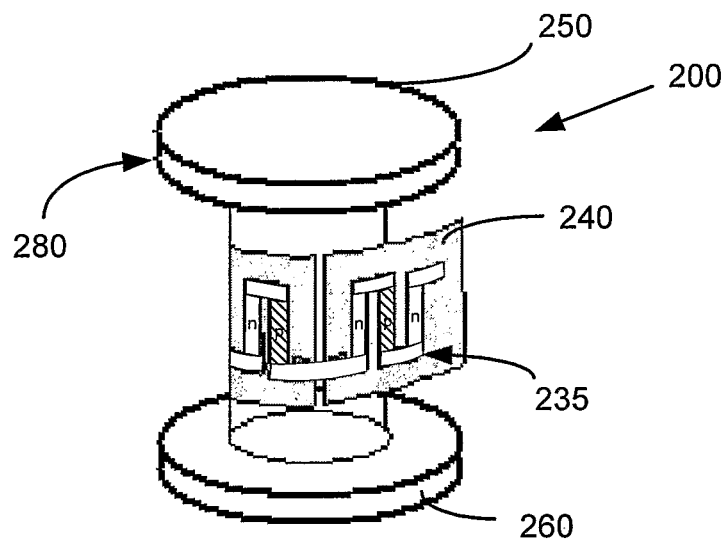
FIG. 5 illustrates an embodiment the disclosed TE power source in which TE thin film modules, such as those illustrated by FIG. 6, are wound about a spindle.
Figure 6:
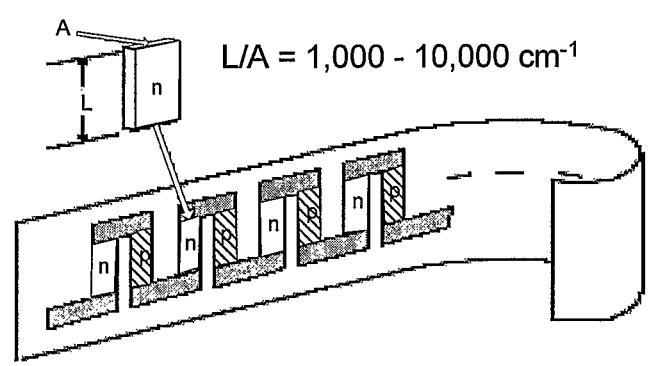
FIG. 6 illustrates an embodiment of the disclosed n-type/p-type TE thin film modules as deposited on a flexible substrate.

In another particular embodiment the TE power source 200 comprises multiple TE couples forming an array of modules 235 deposited onto a flexible substrate 240 (FIG. 5). The array of couples 235 is wound in a coil like fashion and positioned between hot and cold junctions 250 and 260. The array module 235 may simply form a coil or may be wound about an apparatus such as a spindle 280. Such a configuration provides an even smaller TE power source without sacrificing power output.

If a TE power source application requires relatively large currents, the internal resistance of the TE array is preferably made to be relatively low. To do so may involve forming thermoelement films that have relatively low values of L/A. To create films with lower L/A values, relatively wide thermoelements may be deposited and used. The TE power source depicted in FIGS. 7 and 8 may utilize thin film thermoelements having relatively large widths deposited on a flexible substrate such as polyimide tape. The TE module array may then be configured in an accordion-like arrangement and packaged with appropriate feedthroughs, as shown in FIGS. 7 and 8.

The current density of TE power sources as disclosed herein will depend on the total number of thermoelements, and the L and A values for the thermoelements. Put another way, if particular current densities are desirable for a particular TE power source, the number of thermoelements and L and A values may be manipulated to meet such requirements. Referring to an embodiment configured as shown in FIG. 3, if the thermoelements were deposited to have an L value of 1 cm, a width of 0.1 cm and a film thickness of 0.0001 cm, a TE power source based on about 500 of such thermoelements would produce 10 micro amps, whereas with wider thermoelements such as discussed in relation to and illustrated in FIGS. 7 and 8, a current of 100 milliamps could be produced. With either such embodiments, a current density of about 1 Amp/cm$^2$ would flow.

Thin Film TE Thermoelements

The TE thermoelements, although depicted in most of the figures as rectangular in shape, may take any suitable shape. Clearly, with rectangular-shaped thermoelements the dimensions may also be varied depending upon the ultimate application of the resulting TE power source being fabricated. For example, the dimensions of the individual thermoelements length, width, and thickness as well as the number of elements and the array configuration may all be changed (see, e.g., FIGS. 9a and 9b). The resistivity of the n-type and p-type materials may be different, so if one desires to minimize the total resistance, the L/A ratios can be manipulated. In addition, the p-type thermoelements may have different dimensions, such as different widths, than those dimensions of the n-type elements. Furthermore, for thermoelements of widths too great to be easily folded or coiled on a flexible substrate, the thermoelements may be broken up into separate pieces positioned in parallel to one another and in series with the opposite type thermoelements, such as, for example, the configuration shown in FIG. 14 (i.e., in series-parallel configurations).

One group of thermoelectric materials for power generation in the 0° C. to the 100° C. temperature range are semiconductors and related alloys based on $Bi_xTe_y$, $Sb_xTe_y$ and $Bi_xSe_y$ where x is typically about 2 and y is typically about 3. The values of x and y may vary depending upon the power supplied to the sputter deposition targets (or equivalently the flux coming from each target). Such thin film thermoelement materials can be sputtered onto a variety of substrates, such as very useful flexible substrates (e.g., polyimide films such as those currently manufactured by the DuPont Corporation under the KAPTON trademark) which allow for fabricating very compact TE power sources.

The films forming the thermoelements 110, 120 may vary in thickness, but certain embodiments of the disclosed TE devices include thermoelements having thicknesses of at least 0.1 mm. The desirable thickness depends on the ultimate application of the TE power source being fabricated. In addition, the thickness variation will depend on the sputtering system arrangement, but typically fall within +/−5%.

The thermoelements 110, 120 may vary in area but certain embodiments of the disclosed TE devices include thermoelements having an L/A ratio of greater than about 50 cm$^{-1}$. Of course, as mentioned above, the L and A values and/or other dimensions of the thermoelements may be varied as desired according to the desired application of the resulting TE device. The range for the L, A and thickness values depend on the power requirements of the ultimate TE power source being made. If it is desirable to have a power source having a voltage of 1.0 or 2.0 volts, then the choice of L/A values depends on the current requirements. For example, in the first two specific embodiments described above, the L/A value for a TE power source for a sensor is 100,000 and for a nuclear battery the L/A ratio is 50. The third specific embodiment involves an array of TE thermoelement modules having an L/A value about in the range of prior art discrete elements.

An advantage of the present methods for fabricating TE thermoelements is that the thermoelements are being sputter deposited and thus are more controllable and easily manipulated than are thermoelements made by standard approaches involving the growth of crystalline boules followed by cutting. Such prior approaches to defining the thermoelement L/A ratios are impractical on a small scale, let alone on a commercial scale. The templates used in the deposition of the thermoelement thin films are simply varied accordingly; see, for example, FIGS. 12a-12c.

Sputter deposited thin films based on superlattice structures can also be used to fabricate the thermoelectric power sources. Each n-type and p-type film could consist of a multilayer film structure with the individual layers being approximately 10 Å to 200 Å thick, and the total film thickness varying as described for the homogeneous films described herein. For example, and not meant to be limiting, a n-type superlattice film might consist of alternating $Bi_2Te_3$ and $Sb_2Te_3$ layers with thicknesses of 50 Å and 150 Å, respectively, which are deposited at ambient conditions. A p-type superlattice structure may involve a similar structure, but grown with a different substrate temperature. These film structures can have larger values of electrical conductivity and Seebeck coefficient, and lower values of thermal conductivity, all of which allow improved power source efficiency.

Substrate Materials

In certain embodiments, the p-type and n-type TE thermoelements are deposited onto a flexible substrate. The flexible substrate may be, e.g., a polyimide, such as KAPTON, however, any suitable flexible substrate may be used. The substrate should be able to withstand sputter deposition conditions without undue deterioration. In other embodiments TE materials are deposited on a substrate comprising any suitable sufficiently rigid substrate (e.g., glass or other electrically insulating materials that possess relatively low thermal conductivities). Essentially any electrically insulating substrate 140 (FIG. 2a) (or substrate coated with an insulating material) may be utilized for the rigid or flexible TE device as long as the substrate can withstand the deposition conditions and can meet required thermal conductivity levels.

Electrically Conductive Members

Figure 12A:
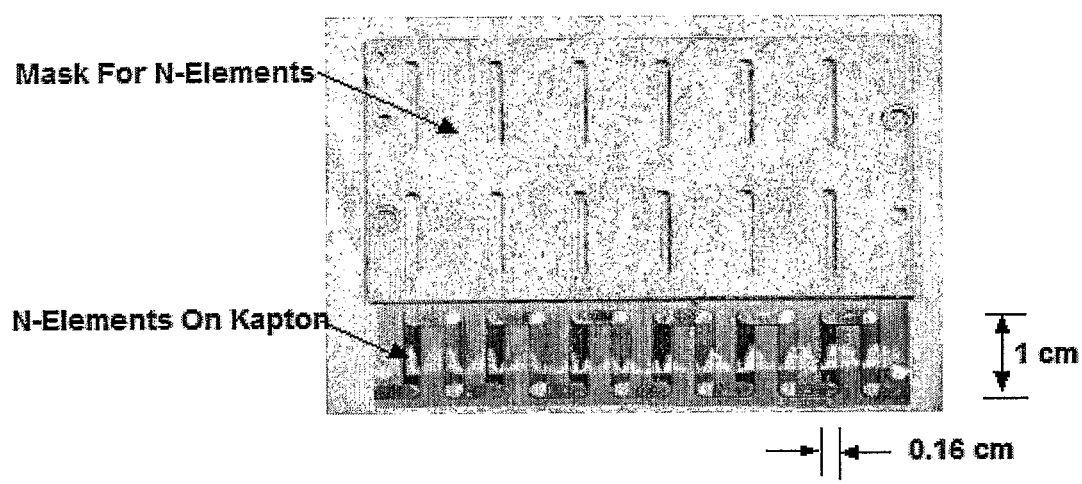
FIG. 12a is a photograph of a representative mask suitable for use in depositing n-type thermoelements in the configuration shown in the embodiments of the TE modules of FIG. 2a and FIG. 6.
Figure 12B:
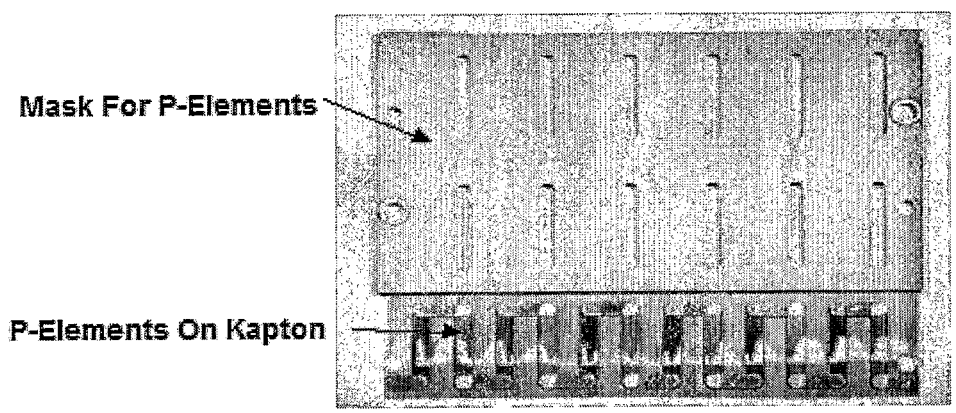
FIG. 12b is a photograph of a representative mask suitable for use in depositing p-type thermoelements in the configuration shown in the embodiments of the TE modules of FIG. 2a and FIG. 6.
Figure 12C:
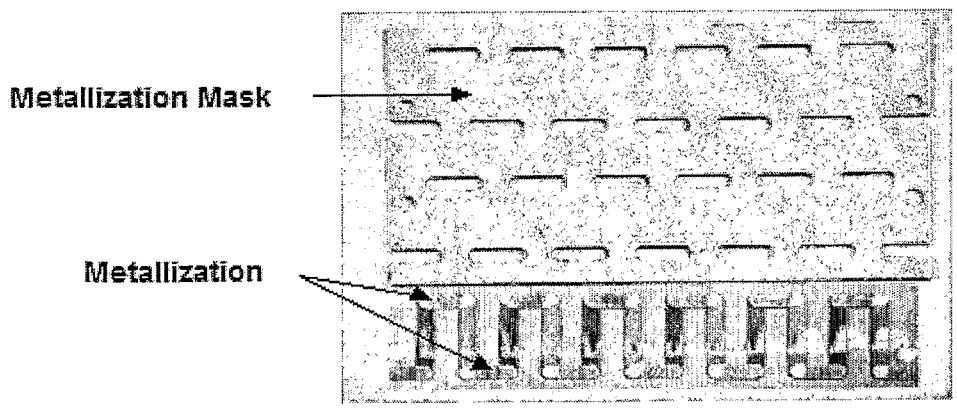
FIG. 12c is a photograph of a representative mask suitable for use in depositing conducting connectors in the configuration shown in the embodiments of the TE modules of FIG. 2a and FIG. 6.
Figure 13:
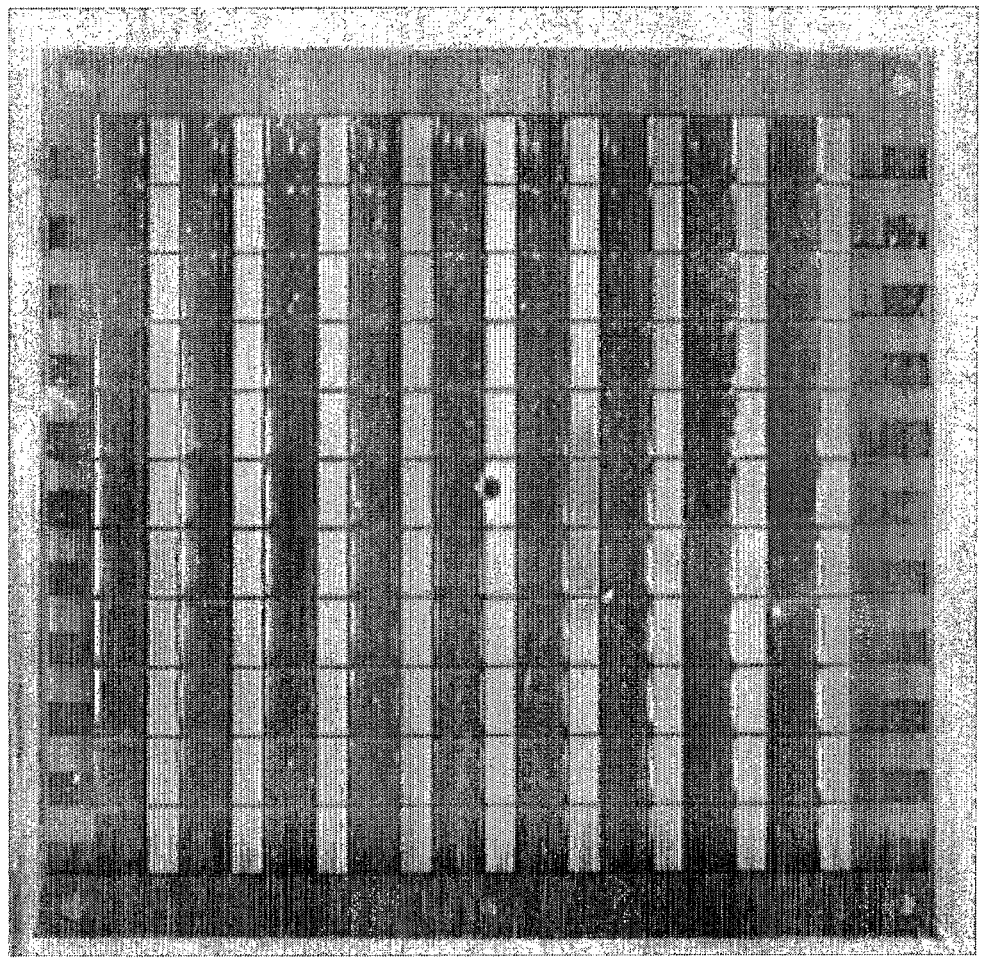
FIG. 13 is a photograph of disclosed n-type and p-type TE thin film modules deposited on a flexible substrate.

As discussed above, TE modules are formed by electrically connecting a thin film n-type thermoelement to a p-type thermoelement through electrically conductive members. The electrically conductive members may comprise any suitable electrically conductive material. For example, the electrically conductive members may comprise a metal, such as aluminum, gold, nickel, and mixtures thereof. In one particular embodiment the conductive members comprise a nickel layer formed on the substrate and a gold layer formed on the nickel layer Methods for Constructing Thin Film TE Elements TE thin film thermoelements and TE modules are formed by sputter deposition. In particular embodiments a mask or template is used as shown in FIGS. 12a-12c. The masks may be formed by standard lithography and/or etching techniques to control the shape and position of each TE thermoelement and conductive member on a substrate.

Figure 2B:
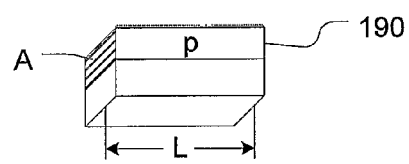

The disclosed process allows for the deposition of many (e.g., hundreds, thousands, or more) TE thermoelement couples on flexible materials such as KAPTON polyimide (available from DuPont). A representative individual p-type TE thermoelement 190 is shown in FIG. 2b, which also illustrates the L/A ratio. High voltage, μW to mW (or greater, e.g., W) TE power sources comprising hundreds or thousands of TE modules can be made with the disclosed process.

Figure 11:
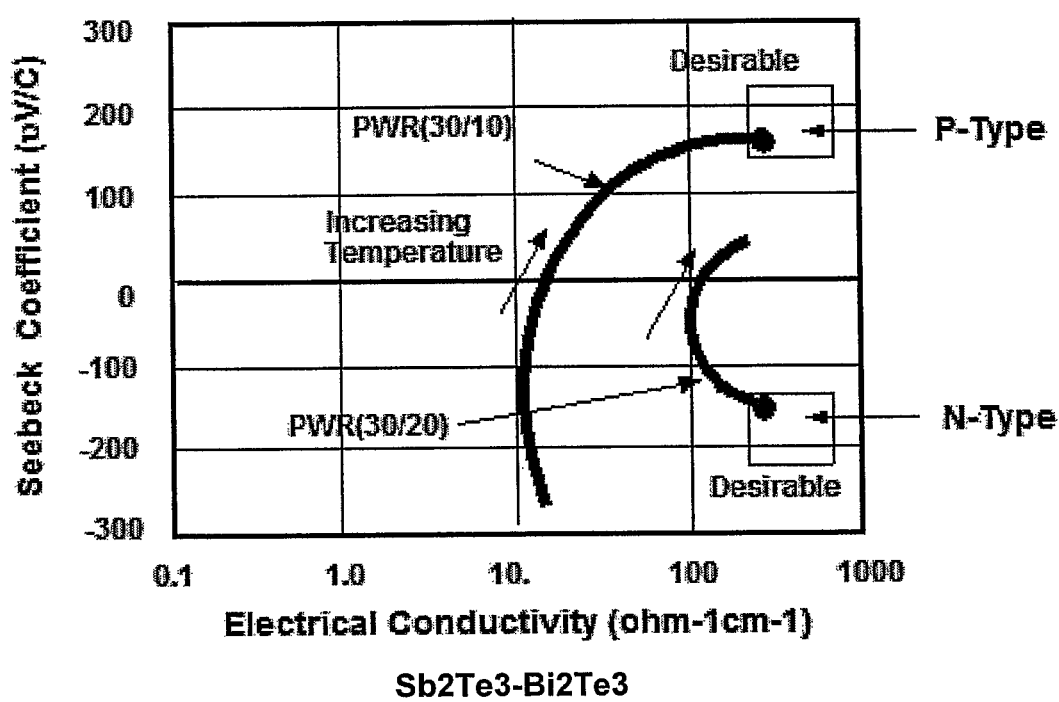
FIG. 11 is a graph showing the dependence of the Seebeck coefficient and electrical conductivity of TE materials deposited on a KAPTON substrate, on sputter deposition conditions.

With reference to FIG. 11 and Table 1 below, a wide range of sputter deposition process parameters were used to obtain TE thermoelement materials having desirable properties. In particular, a myriad of sputtering gas pressures, target powers, deposition rates, target-substrate distances and substrate temperatures were tested. Certain exemplary sputter deposition methods are specifically disclosed below but clearly other sputter deposition parameters may produce suitable thin films for forming the TE thermoelements disclosed herein.

The thin films forming the TE elements may be sputter deposited using, for example, RF magnetron sputtering. The films may be deposited simultaneously from two of three possible sources, for example, and not meant to be limiting, $Bi_2Te_3$, $Sb_2Te_3$ and $Bi_2Se_3$ alloys, or combinations thereof. The amount of RF power supplied to each of the targets, substrate temperature and sputtering gas pressure are varied for deposition conditions that result in films with desired properties which in turn depend upon the application of the device. Representative thin film material parameters and sputtering conditions are shown in FIG. 11. The specific examples given below are not to be considered limiting of the present disclosure but merely representative.

EXAMPLE 1

Sputter Deposition of n-Type Thermoelements

A substrate comprising KAPTON (as well as a glass substrate) was positioned 5 inches from both a $Sb_2Te_3$ (Sb—Te) and a $Bi_2Te_3$ (Bi—Te) target in a standard sputter deposition chamber. Each target measured 2 inches in diameter. The sputter deposition chamber was evacuated to a pressure of $10^{-6}$ Torr and the system was then filled with purified argon adding to the system sputtering gas pressure (e.g., 3.0 mTorr).

The substrates and the targets were each ion cleaned for 3 to 5 minutes. Plasmas were established above the targets with 30 watts of power being supplied to the Sb—Te target and 20 watts of power to the Bi—Te target. The deposition was carried out with the substrates at ambient temperature. Under these conditions, the deposition rate was 3.5 Å/s. Thus, to deposit a one micron thick film required approximately 47 minutes.

After deposition, the thermoelement thin films were characterized. The thickness was measured with a profilometer. The resistivity and Seebeck coefficient also were determined for the deposited thermoelement thin films, as shown in FIG. 11. Resulting values are provided in Table 1.

TABLE 1

Exemplary Parameters For Deposition On KAPTON*

| Substrate Temperature (° C.) | $Sb_2Te_3$ Target Power (Watts) | $Bi_2Te_3$ Target Power (Watts) | Growth Rate (Å/s) | Resistivity (ohm-cm) | Seebeck Coefficient (μV/° C.) |
|---|---|---|---|---|---|
| Ambient | 30 | 20 | 3.5 | 0.0122 | −131 |
| 300 | 30 | 10 | 3.0 | 0.00325 | +158 |

*Sputtering Gas Pressure was 3.0 mTorr; Targets had 2.0 inch diameters; Sb—Te and Bi—Te targets were positioned 5 inches from substrate platform.

EXAMPLE 2

Sputter Deposition of p-Type Thermoelements

A substrate comprising KAPTON (as well as a glass substrate) was positioned 5 inches from both a $Sb_2Te_3$ (Sb—Te) and a $Bi_2Te_3$ (Bi—Te) target in a standard sputter deposition chamber. Each target measured 2 inches in diameter. The sputter deposition chamber was evacuated to a pressure of $10^{-6}$ Torr and the system was then filled with purified argon adding to the system sputtering gas pressure (e.g., 3.0 mTorr).

The substrates were ion cleaned for 3 to 5 minutes. The substrate temperature was then raised to 300° C. The target surfaces were then ion cleaned for 3 to 5 minutes. Plasmas were established above the targets with 30 watts of power supplied to the Sb—Te target and 10 watts of power to the Bi-Te target. The deposition was carried out with the substrates at 300° C. The deposition rate was 3.0 Å/s. Thus, to deposit a one micron thick film required approximately 55 minutes.

After deposition, the thermoelement thin films were characterized. The thickness was measured with a profilometer. The resistivity and Seebeck coefficient also were determined for the deposited thermoelement thin films. Resulting values are provided in Table 1.

As shown in FIG. 11, the temperature of the substrate effectively determines the Seebeck coefficient for each of the deposited thermoelement thin films in the foregoing examples 1 and 2. The curves in FIG. 11 show the results as the temperature of the substrate was increased from ambient (approximately 20° C.) to a final temperature of about 300° C. for both the resultant p-type material and the resultant n-type material. As shown in FIG. 11, the p-type material having a Seebeck coefficient of +158 and resistivity of 0.00325 ohm-cm was formed when $Sb_2$—$Te_3$ and $Bi_2$—$Te_3$ were simultaneously sputtered at a temperature of 300° C. using 30 Watts of power to the $Sb_2$—$Te_3$ and 10 Watts of power to the $Bi_2$—$Te_3$. Conversely, the n-type material, having a Seebeck coefficient of −131 and resistivity of 0.0122 ohm-cm, was formed when $Sb_2$—$Te_3$ and $Bi_2$—$Te_3$ were simultaneously sputtered at ambient temperature (approximately 20° C.) using 30 Watts of power to the $Sb_2$—$Te_3$ and 20 Watts of power to the $Bi_2$—$Te_3$.

While the end points are described as "desirable" in FIG. 11, as shown in the respective curves of FIG. 11, each of these materials fluctuated across a wide range of Seebeck coefficients depending on the substrate temperature. Those skilled in the art will recognize that intermediate points to those shown in the curves will produce satisfactory TE elements. Further, while those skilled in the art will recognize that having one thin film with a positive Seebeck coefficient and the other thin film with a negative Seebeck coefficient will generally produce thermoelectric devices having higher power densities, since it is the delta in the Seebeck coefficients between any two thin films that produces the thermoelectric effect, given a sufficient delta between any two thin films the thermoelectric effect is nevertheless expected, and it is therefore not absolutely critical that one be positive and the other be negative. For example, and not meant to be limiting, most metals, e.g., copper, will have a Seebeck coefficient of about 0. Since copper is highly conductive, using copper as one of the thin films will produce a thermoelectric effect, provided that the other thin film has either a sufficiently high or a sufficiently low Seebeck coefficient. Since metals such as copper are generally highly conductive, an effective TE device could be produced using just such an arrangement. Therefore, the use of the terms "n-type" and "p-type" in the present application should be understood to be relative in nature; and any configurations wherein two highly conductive thin films having a sufficient delta in their Seebeck coefficients should be understood to be included in the applicant's use of the terms "n-type" and "p-type."

EXAMPLE 3

Fabrication of a Thermoelectric Array on KAPTON

Figure 9A:
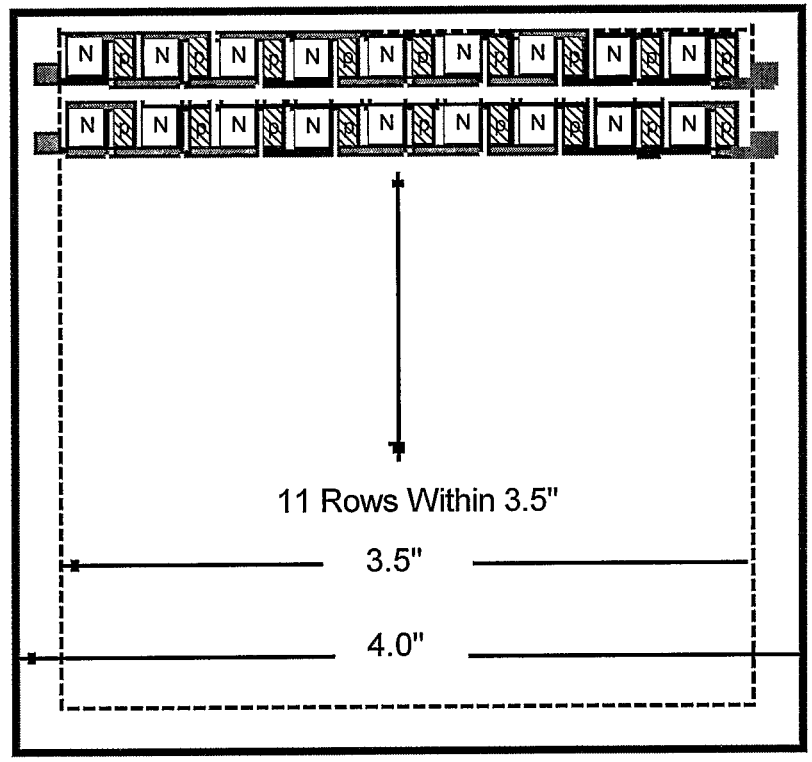
FIG. 9a is an illustration of disclosed n-type and p-type TE thin film modules deposited in an array configuration on a substrate, with representative dimensions for the same.
Figure 9B:
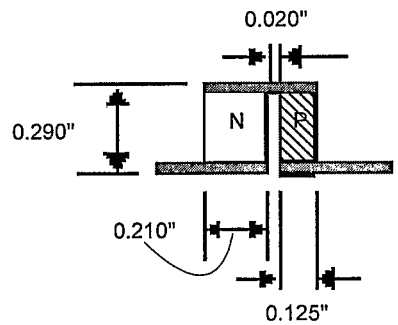
Figure 10:
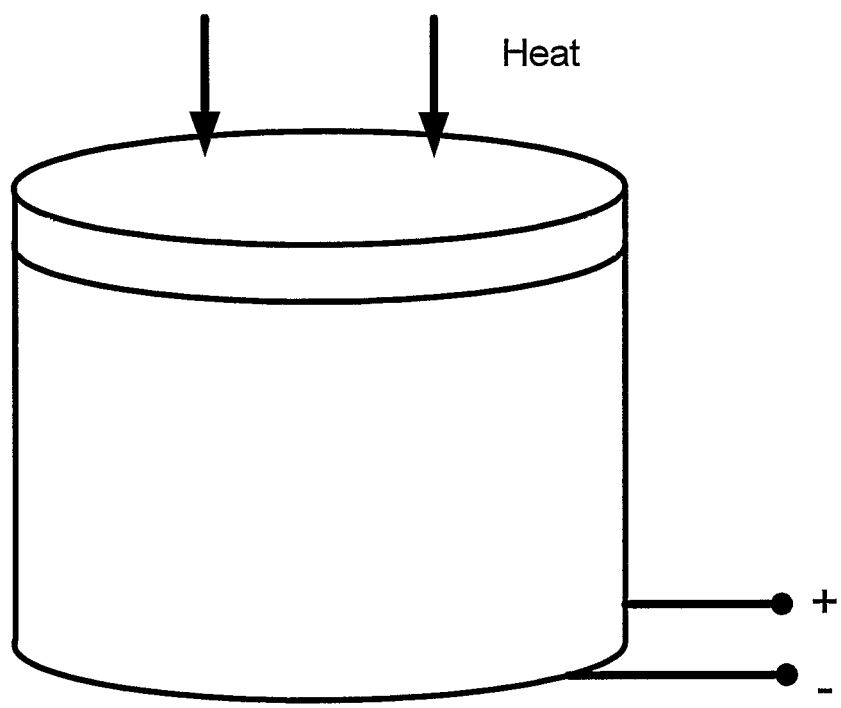
FIG. 10 illustrates a TE sensor that uses heat from one side of the thermopile.

A TE module array like those shown in FIGS. 1a or 9a was fabricated on a substrate comprising KAPTON using masks such as those depicted in FIGS. 12a-12c. The p-type thermoelements were deposited first because they are deposited at 300° C. The n-type thermoelements were deposited next and then the electrically conductive members were deposited.

Specifically, a KAPTON substrate sheet using a mask as shown in FIG. 12b was positioned into a deposition chamber. The mask was securely positioned over the KAPTON sheet using round holes at each end of the mask (see FIG. 12b). Target choices and positioning and other deposition conditions and parameters were as described in Example 2.

Once the desired p-type elements were deposited, the process was stopped and the sputter deposition system opened to replace the p-type mask of FIG. 12b with an n-type mask such as the mask depicted in FIG. 12a. The n-type mask was carefully positioned over the KAPTON sheet, again using the round holes in the mask as guides. Target choices, positioning and other deposition conditions were as described in Example 1.

The process was again stopped once the n-type thermoelements were deposited to replace the n-type mask and with a metallization mask such as the mask depicted in FIG. 12c to form the electrically conductive members. The metallization mask was positioned and secured over the KAPTON sheet using round holes in the mask as guides. By standard sputter deposition procedures, 1.0 μm of aluminum was first deposited, followed by 0.1 μm of nickel.

These deposition processes produced an array of p-type and n-type thermoelement modules on a flexible substrate in the configuration shown in FIGS. 2a, 12a-12c, and 13.

The specific templates or masks shown in FIGS. 12a-12c in the foregoing procedure were used to produce two arrays of six thermocouples deposited on two different strips of KAPTON substrate. Such arrays of TE modules were, for example, assembled into a TE power source such as shown in FIG. 5. The fabrication of arrays of six TE modules would allow for production of, e.g., a 25 µW TE power source with a 1.0 V output at a temperature gradient of only 20° C.

Exemplary TE Power Sources and Applications Utilizing Ambient Energy

Figure 18:
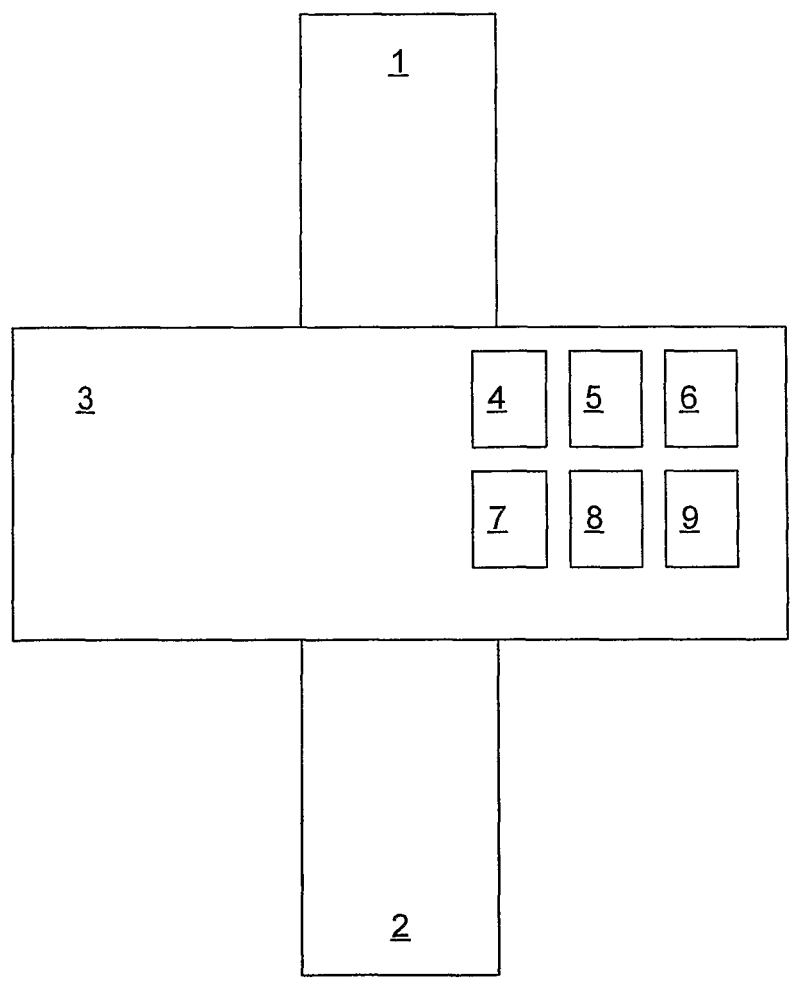
FIG. 18 is a schematic drawing of an embodiment of the disclosed TE power source for harvesting ambient energy.

As shown in FIG. 18, one embodiment of the TE power source for generating electrical energy from an environment having a first temperature region and a second temperature region comprises a thermoelectric device 1 having a first side and a second side wherein the first side is in communication with a first energy transmitter 2 for transmitting ambient thermal energy collected or rejected in the first temperature region and the second side is in communication with the second temperature region thereby producing a temperature gradient across the thermoelectric device and in turn generating an electrical current. In addition to the first energy transmitter 2 for transmitting ambient thermal energy on the first side of the apparatus, this embodiment of the TE power source apparatus further utilizes a second energy transmitter 3 for transmitting ambient energy collected or rejected in the second temperature region and in communication with the second side of the thermoelectric device 1.

Without being limiting, an example of a conductive means for transmitting ambient energy may comprise a heat pipe (discussed below). The terms "transmitting energy" and/or "transmitting ambient energy" should be understood to include, either alone or in combination, collecting ambient energy, focusing ambient energy, or transferring ambient energy, (wherein transferring ambient energy could be performed by convection, conduction, radiation, and combinations thereof), and the means for "transmitting energy" or "transmitting ambient energy" should be understood to include any of the wide variety of devices known to those of ordinary skill in the art, which are capable of collecting ambient energy, focusing ambient energy, or transferring ambient energy, either alone or in combination, and wherein transferring ambient energy is performed by convection, conduction, radiation, and combinations thereof. As examples of these heat (thermal energy) delivery options, heat can be delivered or rejected at the thermally active surfaces of a TE module or TE power source by natural convection in air or any other fluid existing on either side of a barrier, such as ductwork, in which the TE power source is mounted. Heat can be delivered to or removed from the TE device by the conduction and convection that occurs in a heat pipe. In this case, conduction occurs in the walls of the pipe and convection occurs in the interior working fluid contained in the heat pipe. The TE power source may be operated outdoors, where the primary heat input is photon radiation from the sun, and can operate inside, such as where a hot shoe is heated by radiation from a lamp. As is also used herein, "ambient" energy means energy available in or transmitted by media forming the environment surrounding the device and used by the present invention to generate electricity.

Whatever particular means or combination of means are selected for transmitting ambient energy, embodiments of the TE power sources disclosed herein gather enough of the energy in the surrounding environment to generate a useful amount of power to a chosen device or in a particular application. One application of the disclosed thermoelectric power source comprises the TE power source placed at a boundary between two regions in the environment that exhibit pervasive differences in temperature. Means for transmitting the ambient energy in either of these regions to opposite sides, or ends of the thermoelectric device extend into each of the respective energy regions, thereby amplifying the actual temperature difference experienced by the thermoelectric device, and exaggerating the boundary between the two energy regions.

Suitable thermoelectric devices for the disclosed TE power sources may comprise, for example: 1) metallic wire thermocouples including, but not limited to iron-constantan; copper-constantan; chromel-alumel; chromel-constantan; platinum-rhodium alloys and tungsten-rhenium alloys, 2) one or more embodiments of the disclosed thin film TE modules and devices set forth above, such as the TE modules comprising alternating p- and n-type arrays connected electrically in series, parallel or series/parallel. All combinations that can be prepared as p-type semiconductors are suitable. Examples of such p-type materials that may be employed include, but are not limited to, bismuth telluride, lead telluride, tin telluride; zinc antimonide; cerium-iron antimonide; silicon-germanium. All combinations that can be prepared as n-type semiconductors are also suitable. Examples of such n-type materials that may be employed include, but are not limited to, bismuth telluride, lead telluride, cobalt antimonide; silicon-germanium.

As discussed above, the thermoelectric devices used to form TE power sources may comprise the embodiments of thin film TE modules formed of bismuth telluride sputter deposited as thin films on a substrate. Other suitable thin-film TE devices for use in such power sources may include, e.g., superlattice and quantum well structures. As shown in FIG. 18, the TE power sources disclosed herein may provide power to sensors 4, such as but not limited to those used for remote region monitoring and surveillance, measurement of ambient conditions such as environmental temperature, pressure, humidity and intrusion in remote areas and measurement and control of building environments and energy.

The TE power sources disclosed herein may be combined with a battery, capacitor, supercapacitor and/or any suitable device 5 that stores energy electrically for alternately storing and discharging electrical energy produced by the thermoelectric device. The combination of the disclosed TE power sources with any other combination of one or more sensors 4, transmitters 6, voltage amplifiers 7, microprocessors 8, data storage devices 9, batteries or electrical storage devices 5 and voltage regulators 10 wherein the sensor(s) 4, batteries or storage devices 5, voltage amplifiers 7, microprocessors 8, data storage means 9, voltage regulators 10 and transmitters 6 are all ultimately powered by electrical energy from the TE device 1, represents a potential embodiment of the disclosed TE power source. Once set in place, such a device is capable of gathering and transmitting data gathered by the sensor to a remote location for an essentially indefinite period of time and potentially for the lifetime of the application with no further human intervention required.

Example of a TE Power Source for Ambient Energy Conversion

Figure 19:
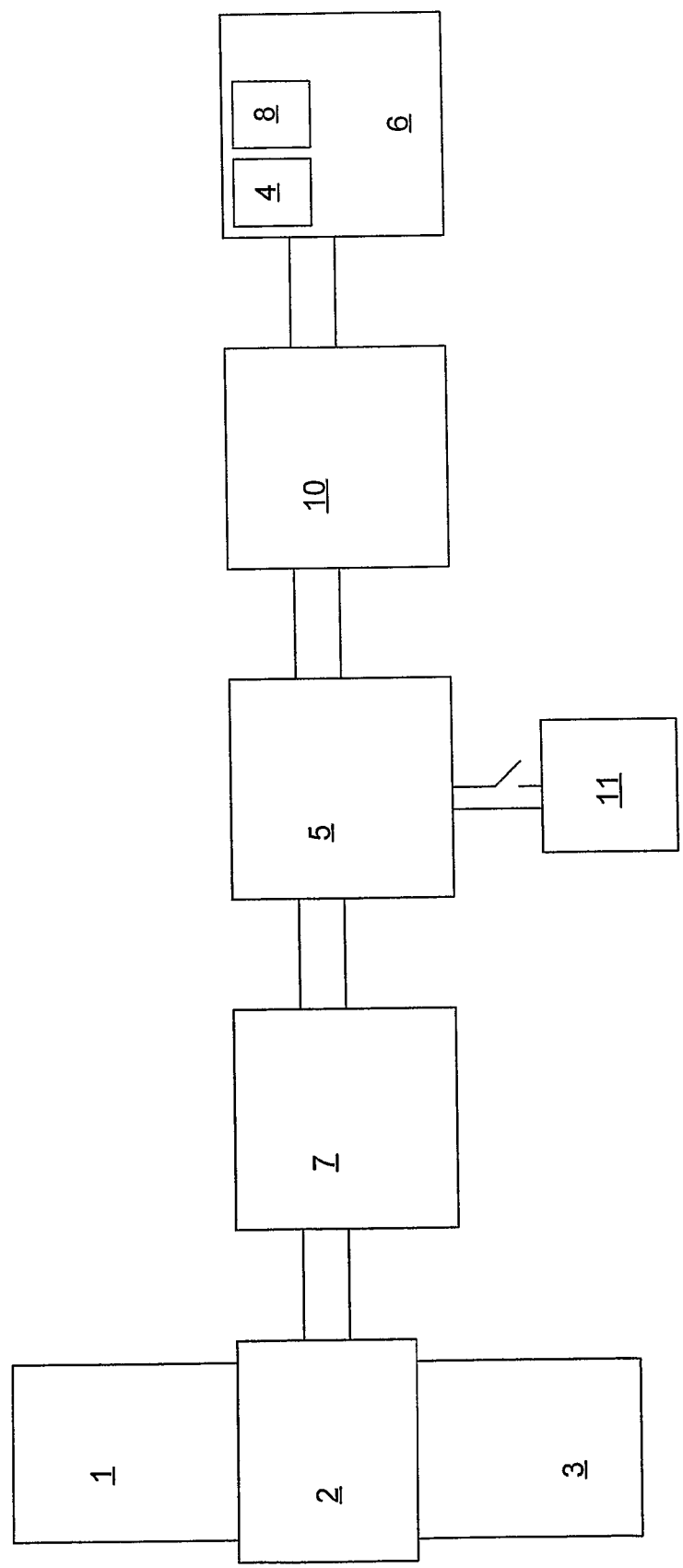
FIG. 19 is a block diagram of an embodiment of components and circuit connections of an embodiment of the disclosed TE power source for harvesting ambient energy.

A particular embodiment of the disclosed TE power source is shown in FIG. 19. In this circuit, a commercial 40 mm×40 mm bismuth telluride thermoelectric element 2 supplied by MELCOR of Trenton, N.J., is attached to heat pipes 1, 3 supplied by Beckwith Electronics of Fenton, Mo. One of the heat pipes supplies thermal energy from the warmer ambient region to the 40 mm×40 mm hot shoe side of the device. The second heat pipe 3 conducts heat from the corresponding 40 mm×40 mm cold shoe located on the opposite side of the thermoelectric element and dissipates this heat in the colder ambient region. The circuit further comprises a voltage amplifier 7, a supercapacitor 5, a temperature sensor 4, a microprocessor 8 that manages data acquisition and storage, a voltage regulator 10 and a radio frequency transmitter 6.

The voltage amplifier 7 transforms the typically few tenths of a volt raw output of the thermoelectric device into as much as a 4.3 V for input into the supercapacitor 5. The system may further include a temperature sensor 4, microprocessor 8, and transmitter 6 subsystem. This system can transmit temperature data when operated with an electrical heat source and ambient cooling. The assembly may also operate in other environments, such as outdoors in a natural environment. The cold side heat pipe 3 may be buried in soil to provide a heat sink. The exposed hot side heat pipe 1 may be positioned to receive ambient heat from air above ground and energy from sun light.

Further Example Power Sources and Applications for the Same

Figure 15:
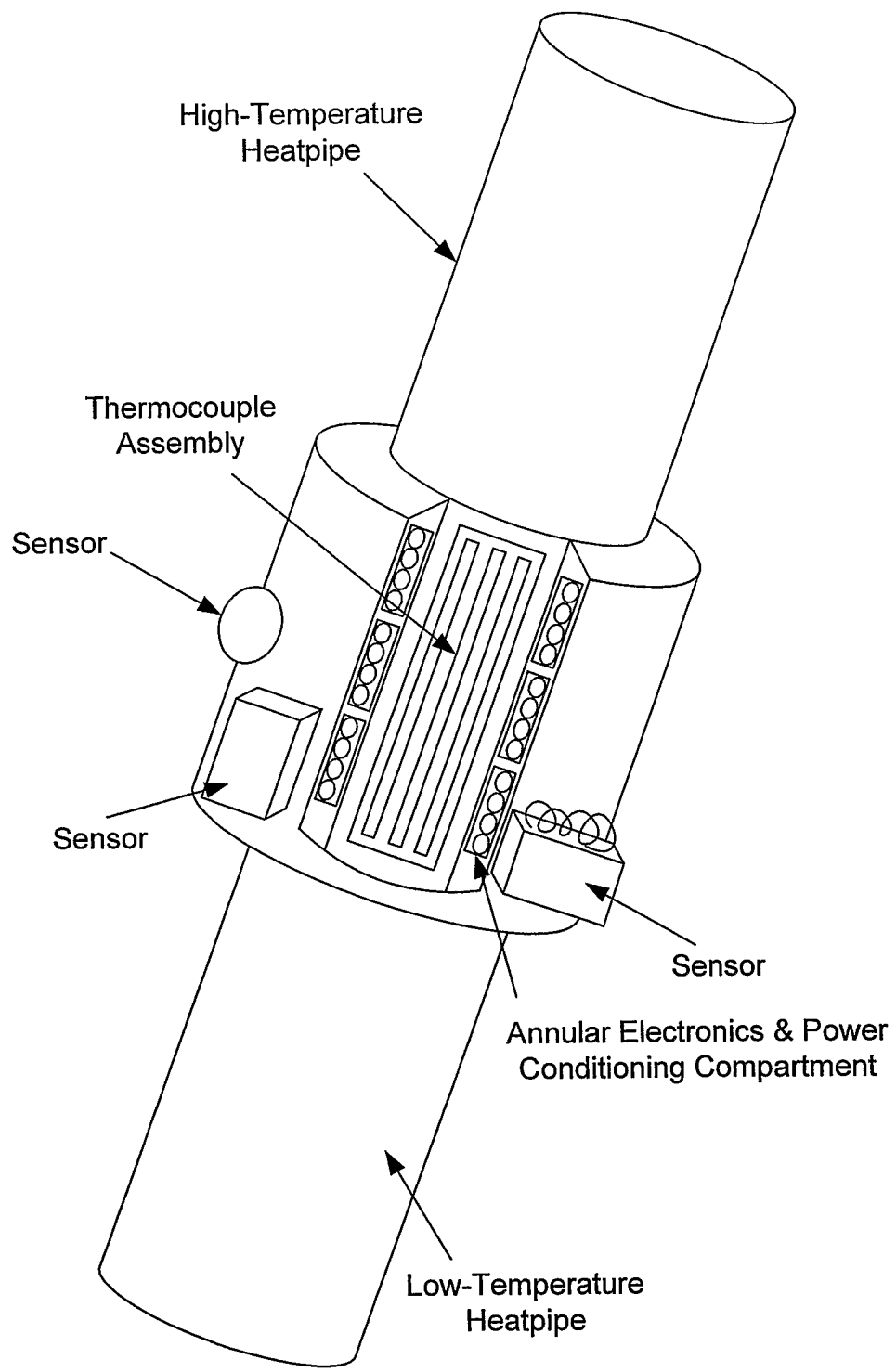
FIG. 15 shows an embodiment of the disclosed TE power source.

As mentioned above, there are a number of possible embodiments of the disclosed TE power sources and applications for the same. For example, embodiments of the disclosed thin film thermocouple assemblies may be used to form an embodiment of the TE power source specifically using heat pipes, as shown in FIG. 15. This particular heat pipe TE power source embodiment may comprise a power source operable at, for example, ambient temperatures. Such an embodiment of the disclosed TE power source may comprise an embodiment of the disclosed thermocouple assembly (TE modules), a heat delivery member and a heat removal member (in this embodiment specific embodiment, such members may comprise low-temperature and high-temperature heat pipes containing, for example, condensable fluids), and interfacing electronics including annular electronics, and power conditioning compartments. The heat pipes may be coupled to hot and cold connections of the TE modules. One or both sides of the TE power source can be heated or cooled by other heat transport methods such as conduction, convection, and/or radiation.

One or more sensors or other applications, for example, may be powered by the disclosed power source. The TE ambient power source embodiment shown in FIG. 15 can produce power in the range of from about 100 microwatts to about 100 milliwatts, from small ambient differences in temperature (e.g., less than about 5° C., less than about 2° C., or less than about 1° C.). For example, the disclosed TE heat pipe power source may operate in environments where natural temperature differences exist, such as above and below ground surface, water to air temperature differences, skin to air temperature differences or on either side of ductwork that delivers heating, ventilation, and/or air-conditioning in buildings or appliances. Embodiments of the disclosed power sources can operate in extreme temperature environments, e.g., as cold as about −100° C. or as hot as about 250° C.

Certain embodiments of the disclosed power sources can utilize energy directly from the local environment of the application using engineered heat gathering and dissipation components to power applications such as sensors and radio frequency transmitters used to send data the sensors generate, for a wide range of remote monitoring applications, e.g., building energy management, automotive component controls, agricultural monitoring, security surveillance and wildlife management without the need for conventional power sources such as batteries and hard-wired alternative power solutions. Such devices provide essentially maintenance free, continuous power for sensors and other applications.

More specifically, embodiments of the disclosed TE power sources may be used to power sensors for military weapons proliferation control, battlefield operations, intelligence gathering, safeguards and security activities. Embodiments of the disclosed power sources may be used to power sensors for law enforcement remote monitoring and surveillance, intrusion detection, material accountability, smuggling and like applications. Homeland security may use embodiments of the disclosed TE power sources for intruder sensing, detection, and alarming, border security, chemical and/or biological weapons detection in mailboxes, post offices, public transport, and sensors for buildings. Hospitals may use embodiments of the disclosed TE power sources for pathogen detectors in HVAC systems and corridors, and patient monitoring. The power sources may power sensors for monitoring soil, water delivery, fertilizer and pesticide distribution. They may also be used for tracking threatened and endangered species, body heat activated prosthetics, monitors, hearing aids, communications, convenience, or vanity items, such as, body heat-powered wristwatches, communication equipment, electric jewelry, cell phones, computers, infrared/radar radiation detectors used in a variety of civilian and military applications, humidity, heat, and light sensors, and for safety applications such as personal tracking devices for climbers, backpackers, children, and pets.

Figure 16:
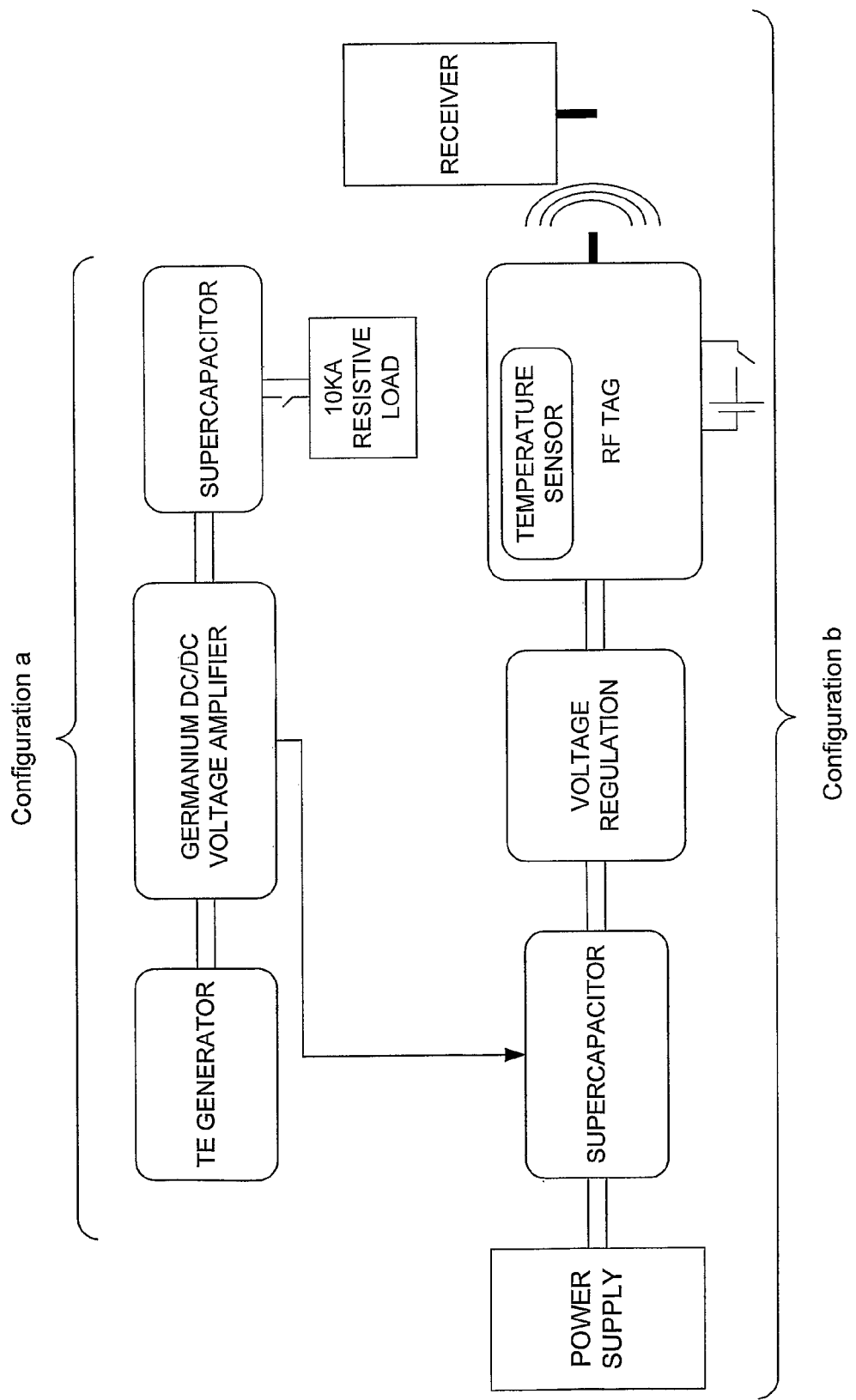
FIG. 16 is a block diagram showing an embodiment of the disclosed TE power source in a sensor system.

Another example of an ambient powered sensor system including embodiments of the disclosed TE power sources is disclosed with reference to the system shown in FIG. 16. This assembly comprises a thermoelectric power source, a heat management subsystem, power conditioning electronics, sensor, and radio frequency transmitter and was tested as discussed immediately below.

Experimental operations of the disclosed TE power sources indicated excellent results. Ambient heat input to the thermoelement was simulated using a hot-air gun for convenience. Under simulated ambient conditions, the intrinsic voltage output of the thermoelectric device is a few hundred millivolts. This voltage may be amplified to at least 3.6 V corresponding to the voltage normally supplied by a lithium battery to power the radio frequency components. Because the thermoelectric output voltage may be too low to activate silicon-based electronic power conditioning, a voltage amplifier using germanium transistors may be included to provide a 4.2-V output to the system. A supercapacitor may be utilized to store energy so that the radio frequency stage operates regardless of fluctuations in ambient conditions that affect the output of the thermoelectric converter.

A resistive load box used to simulate the energy drain required to operate the sensor and radio frequency tag was used. This load was manually switched on for periods of about 10 seconds at a frequency representing the transmission cycle of the radio frequency tag to drain the equivalent of the total sleep-mode, data acquisition and storage, and transmission energy consumed in each cycle. By respectively heating and cooling the hot and cold shoes of the thermoelectric module and applying the load periodically as indicated above, the thermoelectric power source was shown to be capable of maintaining capacitor voltage and thereby supply the energy drain of a simulated temperature sensor and radio frequency tag that transmitted data every 10 minutes.

The system may further include components as shown in Configuration b of FIG. 16. A conventional regulated laboratory power supply was substituted for the thermoelectric converter and voltage amplifier to permit customizing the sensor and radio frequency subsystem. The sensor and transmitter were adapted from a radio frequency tag that measures, stores, and transmits environmental temperature and shock date. The tag was modified to retain only the temperature measurement function and was reprogrammed to draw less energy than its unmodified counterpart. A voltage regulator circuit may be included to inhibit or essentially prevent draining the capacitor to a voltage that would be too low to maintain microprocessor function. An external switch may be added to isolate the battery normally required to operate the radio frequency tag. The tag includes a microprocessor that is programmed before operation.

The battery maintains the program whenever the power supply or the thermoelectric module is not connected. Testing this configuration involved first using the battery to "launch" the program, then isolating it after power was available from the alternative source. A remotely located receiver was used to confirm data transmission. The test sequence using Configuration b of FIG. 16 established that full functionality of the sensor and radio frequency stage could be maintained when the laboratory power supply provided an input to the supercapacitor equivalent to the thermoelectric output characteristics measured with Configuration a of FIG. 16.

Figure 17:
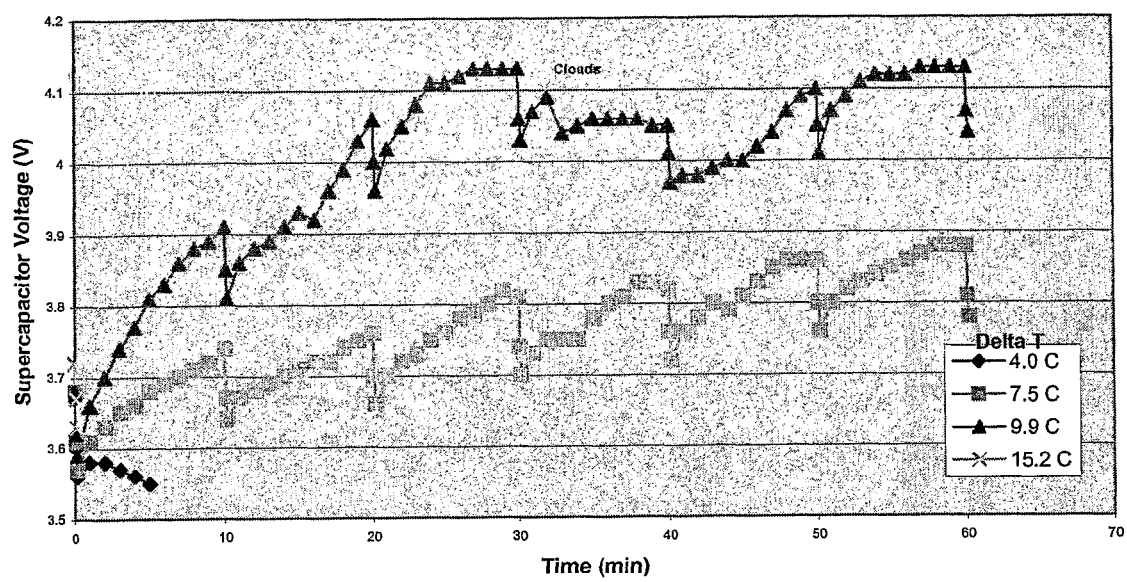
FIG. 17 is a graph of supercapacitor voltage plotted against time measured using the embodiment shown as Configuration a, of FIG. 16.

FIG. 17 displays supercapacitor voltage plotted against time measured with Configuration a of FIG. 16 outdoors with solar input to the hot shoe of the thermoelectric generator and a heat sink in earth connected to the cold shoe. These records show the ability of the thermoelectric power source to recharge the supercapacitor (i.e., maintain a voltage in excess of 3.6 V) if a temperature difference greater than about 7° C. exists across the device. At the same time, the capacitor is supplying the demand of the sensor and radio frequency tag system transmitting data every 10 minutes. The voltage steps at 10-minute intervals shown by the successful recharge characteristics represent the approximately 20-mJ energy drain associated with the evaluated load cycle. The 9.9° C. record shows the disclosed power source's ability to ride through variability in ambient energy input as illustrated by the slower rate of recharge during a 10-minute interval (between 30 and 40 minutes) when clouds temporarily reduce solar energy input.

As mentioned above, the heat pipe embodiment of the disclosed TE power source may be used to exploit natural temperature differences, such as those that exist between free air and in-soil environments. In such an environment, an upper heat pipe communicates thermal energy harvested from free air to the hot shoe of the thermoelectric module(s). The lower heat pipe conducts waste thermal energy to a heat sink provided by, for example, underlying soil. Clearly, the heat pipes can be composed of a variety of materials and may be formed in various geometries with various dimensions, as would be desirable for particular applications, as known to those persons of ordinary skill in the art.

This disclosed power source produces a useful output bi-directionally, i.e., both when the air is hotter than the soil and vice versa. The double heat pipe is particularly useful if the device is operated in the bi-directional mode, especially when the soil is warmer than the air. In this case, both heat pipes operate as reflux boilers to pump thermal energy through the thermoelectric modules and can exploit gravity-assisted return of internal working fluid to their respective evaporator sections.

An operational mode where energy is harvested from ambient air and conducted downward through the thermoelectric converter to an underground heat sink can be one of many operational modes. This mode allows replacing the upper heat pipe with a thermally absorptive hot shoe extension. However, fluid flow in the lower heat pipe results from evaporation at the underside of the thermoelectric cold shoe and condensation at the lower extremity of the heat pipe where heat is given up to the soil. Re-circulation of the working fluid in this mode of operation may employ a wick structure on the inside of the pipe to draw the condensate back up to the evaporator region against gravity. A wicking height of about 20 cm can be reached but wicking height is constrained by the physical properties of conventional heat pipe working fluids.

The disclosed thermocouple module comprising many thin-film bismuth telluride thermoelectric elements deposed on, for example, a flexible substrate may be used in this disclosed power source. The thermoelectric module may be in the form of a rolled up strip of thin-film elements wound on a small reel or bobbin that forms the core of the device. The disclosed embodiment of the power source is readily scalable to higher power levels by increasing the number of thermoelectric elements on the roll. Many tens of thousands of thermoelectric elements may be incorporated in series and/or series/parallel arrangements to produce device electrical outputs of up to several of watts.

The ends of the reel may function as the hot and cold shoes of the thermocouple module. Heat pipes may be attached at the ends of the reel to transfer heat through the thermoelectric module, such as from an air side to an in-soil side of the power source. The heat pipes may use, e.g., water as a working fluid, unless freezing conditions have to be accommodated. In this case, methanol or other suitable liquids, such as other alcohols can be used.

The outer surfaces of the air-side heat pipe may be coated with a material having a highly absorptive surface to maximize collection of solar radiation, as well as sensible heat from the ambient air. A suitable, surface-treated hot shoe may be substituted for the air-side heat pipe. This embodiment may include the advantage of reducing an infrared signature of the deployed system. Insulation may be applied to a portion of the lower heat pipe to prevent heat leakage into it from relatively warmer soil near the surface.

The disclosed thermoelectric power source embodiment may nominally generate 330-µW of dc power with an output of 100 µA at 3.3 V. A lower voltage device may be assembled with a dc/dc inverter to achieve a 3.3-V output. The inverter may comprise, for example, a silicon-based micro-electronic circuit. It could also incorporate a super-capacitor to provide energy storage to maintain mission functions when the temperature differential across the TE generator is less than 20° C.

Whereas the TE thermoelements, modules, arrays and power sources as well as the methods for making the same and applications for the same, have been described with reference to multiple embodiments and examples, it will be understood that the invention is not limited to those embodiments and examples. On the contrary, the invention is intended to encompass all modifications, alternatives, and equivalents as may be included within the spirit and scope of the invention as defined by the appended claims.

We claim:

1. A method for providing electrical energy to an electrical device in an environment having a first and a second temperature region comprising the steps of:
   providing a means for transmitting ambient energy collected in the first temperature region,
   providing a thermoelectric device having a plurality of thermoelectric couples, the thermoelectric couples comprising:
   a thin film p-type thermoelement, a thin film n-type thermoelement and an electrically conductive member electrically connecting a first end of the p-type thermoelement with a second end of the n-type thermoelement, wherein the thermoelectric couples are formed on a single flexible substrate and the flexible substrate is in a coil configuration;

wherein the p-type or the n-type thermoelements comprise $Bi_xTe_y$, $Sb_xTe_y$, or $Bi_xSe_y$, wherein x and y form a non-stoichiometric compound wherein x is about 2 and y is about 3 and have L/A ratios from about 100 $cm^{-1}$ to about 10,000 $cm^{-1}$;

providing the means for transmitting the ambient energy collected in the first temperature region in communication with a first side of the thermoelectric device, and providing a second side of the thermoelectric device in communication with the second temperature region.

2. The method of claim 1 further comprising providing a power output of from 50 µW to 1 W from the thermoelectric device.

3. The method of claim 2 wherein the p-type or the n-type thermoelements are at least about 0.001 mm in thickness.

4. The method of claim 1 wherein the thermoelectric couples are assembled in alternating p- and n-type arrays connected electrically in series, parallel, and in combinations thereof.

5. The method of claim 1 wherein the p-type thermoelements are selected from the group consisting of bismuth telluride, lead telluride, tin telluride, zinc antimonide, cerium-iron antimonide, silicon-germanium, and combinations thereof.

6. The method of claim 1 wherein the n-type thermoelements are selected from the group consisting of bismuth telluride, lead telluride, cobalt antimonide; silicon-germanium, and combinations thereof.

7. The method of claim 1 wherein the thermoelectric elements comprise thin film semiconductors selected as having p-type materials fabricated of bismuth telluride, lead telluride, tin telluride, zinc antimonide, cerium-iron antimonide, silicon-germanium, and combinations thereof sputter deposited as thin films on a substrate; and n-type semiconductors fabricated of bismuth telluride, lead telluride, cobalt antimonide, silicon-germanium and combinations thereof sputter deposited as thin films on a substrate.

8. The method of claim 7 wherein the thin film semiconductors are selected as bismuth telluride sputter deposited as thin films on the single flexible substrate.

9. The method of claim 1 further comprising providing a second means for transmitting ambient energy collected in the second temperature region in communication with the second side of the thermoelectric device and in communication with the second temperature region.

10. The method of claim 1 wherein the step of transmitting ambient energy is performed by means selected from collecting ambient energy, focusing ambient energy, transferring ambient energy, and combinations thereof.

11. The method of claim 10 wherein the step of transferring ambient energy is performed by means selected from convection, conduction, radiation, and combinations thereof.

12. The method of claim 1 wherein the temperature difference between the first temperature region and the second temperature region is between about −18° C. and 38° C.

13. The method of claim 1 wherein the temperature difference between the first temperature region and the second temperature region is between about −18° C. and 10° C.

14. An apparatus for generating electrical energy from an environment having a first temperature region and a second temperature region comprising a thermoelectric device having a first side and a second side wherein the first side is in communication with a first means for transmitting ambient thermal energy collected in the first temperature region and the second side is in communication with a second means for transmitting ambient energy collected in the second temperature region in communication with the second side of the thermoelectric device;

the first means for transmitting ambient thermal energy comprising a high-temperature heat pipe connected to a hot connection of the thermoelectric device to operate in the Seebeck mode to transfer heat spontaneously by direct conduction to and from the thermoelectric device utilizing a working fluid;

the apparatus not including an electrical and/or mechanical power device, other than gravity, external to the high temperature heat pipe acting on the working fluid to transfer heat to and from the thermoelectric device; and the thermoelectric device selected from the group consisting of metallic wire thermocouples and discrete thin film thermoelements formed of semiconductor materials, the thin film thermoelements assembled in alternating p- and n-type arrays, and combinations thereof.

15. The apparatus of claim 14 wherein the second means for transmitting ambient energy collected in the second temperature region comprises a low-temperature heat pipe connected to a cold connection of the thermoelectric device, and wherein the low-temperature heat pipe transfers heat to and from the thermoelectric device by a phase change of a working fluid.

16. The apparatus of claim 14 wherein the thermoelectric device comprises metallic wire thermocouples selected from the group consisting of iron-constantan; copper-constantan; chromel-alumel; chromel-constantan; platinum-rhodium alloys and tungsten-rhenium alloys, and combinations thereof.

17. The apparatus of claim 14 wherein the thin film thermoelements of the thermoelectric device are assembled in alternating p- and n-type arrays and connected electrically in series, parallel, and in combinations thereof.

18. The apparatus of claim 17 wherein the p-type arrays are selected from the group consisting of bismuth telluride, lead telluride, tin telluride, zinc antimonide, cerium-iron antimonide, silicon-germanium, and combinations thereof.

19. The apparatus of claim 17 wherein the n-type arrays are selected from the group consisting of bismuth telluride, lead telluride, cobalt antimonide; silicon-germanium, and combinations thereof.

20. The apparatus of claim 15 wherein the thin film thermoelements are formed of bismuth telluride sputter deposited as thin films on a flexible substrate.

21. The apparatus of claim 15 wherein the phase change of the working fluid is a change from a liquid to a vapor and/or from a vapor to a liquid.

22. The apparatus of claim 14 wherein the means for transmitting ambient energy is selected from an ambient energy collection means, an ambient energy focusing means, an ambient energy transmission means, and combinations thereof.

23. The apparatus of claim 22 wherein the ambient energy transferring means is selected from a convection means, a conduction means, a radiation means, and combinations thereof.

24. The apparatus of claim 14 further comprising a means for alternately storing and discharging electrical energy produced by the thermoelectric device.

25. The apparatus of claim 14 wherein a means for alternately storing and discharging electrical energy produced by the thermoelectric device is selected from the group consisting of a battery, a capacitor, a supercapacitor, and combinations thereof.

26. The apparatus of claim 24 further comprising at least one sensor powered by electrical energy discharged from the means for alternately storing and discharging electrical energy produced by the thermoelectric device.

27. The apparatus of claim 26 further comprising at least one transmitter powered by electrical energy discharged from the means for alternately storing and discharging electrical energy produced by the thermoelectric device and capable of transmitting data gathered by the sensor.

28. The apparatus of claim 14 further comprising at least one voltage amplifiers for amplifying the voltage of electrical energy generated by the thermoelectric device.

29. The apparatus of claim 26 further comprising at least one microprocessor capable of processing the data gathered by at least one of the sensors.

30. The apparatus of claim 26 further comprising at least one data storage means capable of storing the data gathered by at least one of the sensors.

* * * * *